(12) United States Patent
Ozaki et al.

(10) Patent No.: US 10,796,917 B2
(45) Date of Patent: Oct. 6, 2020

(54) METHOD FOR MANUFACTURING GATE INSULATOR FOR HEMT

(71) Applicant: FUJITSU LIMITED, Kawasaki-shi, Kanagawa (JP)

(72) Inventors: Shirou Ozaki, Yamato (JP); Kozo Makiyama, Kawasaki (JP); Naoya Okamoto, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/385,161

(22) Filed: Apr. 16, 2019

(65) Prior Publication Data

US 2019/0244821 A1 Aug. 8, 2019

Related U.S. Application Data

(62) Division of application No. 15/600,260, filed on May 19, 2017, now Pat. No. 10,312,094.

(30) Foreign Application Priority Data

May 25, 2016 (JP) .................. 2016-104276

(51) Int. Cl.
*H01L 21/28* (2006.01)
*H01L 21/02* (2006.01)
(Continued)

(52) U.S. Cl.
CPC .. *H01L 21/28264* (2013.01); *H01L 21/02178* (2013.01); *H01L 21/02194* (2013.01);
(Continued)

(58) Field of Classification Search
CPC ............ H01L 29/517; H01L 29/66462; H01L 29/778–7789; H01L 21/02233;
(Continued)

(56) References Cited

U.S. PATENT DOCUMENTS 8,309,987 B2 11/2012 Derluyn
9,412,830 B2 8/2016 Makiyama
(Continued)

FOREIGN PATENT DOCUMENTS

JP 2002-359256 12/2002
JP 2010-045343 2/2010
(Continued)

OTHER PUBLICATIONS

USPTO, (Luke) Notice of Allowance and Notice of Allowability, dated Feb. 27, 2019, in parent U.S. Appl. No. 15/600,260 [allowed].
(Continued)

*Primary Examiner* — Daniel Luke
(74) *Attorney, Agent, or Firm* — Fujitsu Patent Center

(57) ABSTRACT

A semiconductor device includes: a first semiconductor layer formed, on a substrate, of a nitride semiconductor; a second semiconductor layer formed, on the first semiconductor layer, of a nitride semiconductor; a source electrode formed on the second semiconductor layer; a drain electrode formed on the second semiconductor layer; a metal oxide film formed, between the source electrode and the drain electrode, on the second semiconductor layer; and a gate electrode formed on the metal oxide film. The metal oxide film includes $AlO_x$ and $InO_x$. $AlO_x/InO_x$ in the metal oxide film is greater than or equal to 3.

6 Claims, 21 Drawing Sheets

(51) Int. Cl.

| | |
|---|---|
| *H01L 29/778* | (2006.01) |
| *H01L 29/51* | (2006.01) |
| *H01L 29/66* | (2006.01) |
| *H01L 23/495* | (2006.01) |
| *H02M 5/458* | (2006.01) |
| *H03F 3/193* | (2006.01) |
| *H03F 1/32* | (2006.01) |
| *H03F 3/24* | (2006.01) |
| *H01L 29/20* | (2006.01) |
| *H01L 29/423* | (2006.01) |
| *H02M 3/335* | (2006.01) |
| *H02M 3/337* | (2006.01) |
| *H02M 1/00* | (2006.01) |

(52) U.S. Cl.
CPC .. *H01L 21/02241* (2013.01); *H01L 21/02255* (2013.01); *H01L 23/49562* (2013.01); *H01L 29/513* (2013.01); *H01L 29/517* (2013.01); *H01L 29/66462* (2013.01); *H01L 29/7786* (2013.01); *H02M 5/458* (2013.01); *H03F 1/3247* (2013.01); *H03F 3/193* (2013.01); *H03F 3/245* (2013.01); *H01L 29/2003* (2013.01); *H01L 29/4236* (2013.01); *H01L 29/42368* (2013.01); *H01L 2224/0603* (2013.01); *H01L 2224/48247* (2013.01); *H01L 2224/48257* (2013.01); *H01L 2224/48472* (2013.01); *H01L 2224/4903* (2013.01); *H01L 2924/181* (2013.01); *H02M 3/337* (2013.01); *H02M 3/33576* (2013.01); *H02M 2001/007* (2013.01)

(58) Field of Classification Search
CPC ........... H01L 21/0223; H01L 21/28264; H01L 21/02178; H01L 21/02194; H01L 21/02241
See application file for complete search history.

(56) References Cited

U.S. PATENT DOCUMENTS

| | | | |
|---|---|---|---|
| 9,443,968 | B2 | 9/2016 | Hwang |
| 9,755,061 | B2 | 9/2017 | Ozaki |
| 2010/0012977 | A1 | 1/2010 | Derluyn et al. |
| 2012/0211761 | A1 | 8/2012 | Yamada |
| 2014/0264451 | A1 | 9/2014 | Ozaki et al. |
| 2015/0303291 | A1 | 10/2015 | Makiyama et al. |
| 2016/0300926 | A1 | 10/2016 | Makiyama et al. |
| 2017/0256400 | A1 | 9/2017 | Makiyama et al. |
| 2017/0352752 | A1 | 12/2017 | Ozaki et al. |

FOREIGN PATENT DOCUMENTS

| | | |
|---|---|---|
| JP | 2012-174875 | 9/2012 |
| JP | 2013-235986 | 11/2013 |
| JP | 2014-183080 | 9/2014 |
| JP | 2015-207589 | 11/2015 |

OTHER PUBLICATIONS

USPTO, (Luke) Non-Final Rejection, dated Nov. 2, 2018, in parent U.S. Appl. No. 15/600,260 [allowed].
USPTO, (Luke) Restriction Requirement, dated Jun. 28, 2018, in parent U.S. Appl. No. 15/600,260 [allowed].
JPOA—Office Action dated Oct. 8, 2019 issued with respect to the basic Japanese Patent Application No. 2016-104276, with full machine translated office action.
JPOA—Office Action dated Apr. 28, 2020 issued with respect to the basic Japanese Patent Application No. 2016-104276, with full machine English translation. ** References 1-2 cited in the JPOA were previously submitted in the IDS filed on Dec. 8, 2019.

METHOD FOR MANUFACTURING GATE INSULATOR FOR HEMT

CROSS-REFERENCE TO RELATED APPLICATION

This application is a divisional of application Ser. No. 15/600,260, filed May 19, 2017, which is based upon and claims the benefit of priority of the prior Japanese Patent Application No. 2016-104276, filed on May 25, 2016 the entire contents of which are incorporated herein by reference.

FIELD

The embodiments discussed herein relate to a semiconductor device and a method for producing a semiconductor device.

BACKGROUND

Materials such as GaN, AlN, and InN that are nitride semiconductors and their mixed crystals have a wide band gap and are used for devices such as high output electronic devices or short wavelength light-emitting devices. For high output devices, techniques relating to Field-Effect Transistors (FET) and High Electron Mobility Transistors (HEMT) are developed (for example, Patent Document 1). HEMTs using such nitride semiconductors are used for devices such as high output/high efficiency amplifiers or high power switching devices.

As for a FET using nitride semiconductors, a HEMT, which uses GaN in an electron transport layer and uses AlGaN in an electron supply layer, is known. Two-Dimensional Electron Gas (2DEG) is generated in the electron supply layer through piezoelectric polarization or spontaneous polarization in GaN. Further, so as to make output and efficiency of a HEMT higher, a HEMT, which uses GaN in an electron transport layer and uses InAlN in an electron supply layer, is known. Spontaneous polarization of InAlN is high. Therefore, by using InAlN in the electron supply layer, it is possible to generate high concentration 2DEG and to cause a drain current to flow more than that of the HEMT using AlGaN in the electron supply layer.

When InAlN is used in an electron supply layer, the surface of InAlN is easily oxidized, current collapse is caused by indium oxide ($InO_x$) included in oxide of InAlN, and a drain current decreases. Because $InO_x$ formed by oxidation of InAlN is chemically unstable, an oxygen defect is likely to occur. When an electron is trapped in the oxygen defect in $InO_x$, a concentration of the 2DEG decreases, current collapse occurs, and a drain current decreases.

RELATED-ART DOCUMENTS

Patent Documents

[Patent Document 1] Japanese Laid-open Patent Publication No. 2002-359256
[Patent Document 2] Japanese Laid-open Patent Publication No. 2012-174875
[Patent Document 3] Japanese Laid-open Patent Publication No. 2013-235986

SUMMARY

According to an aspect of the embodiments, a semiconductor device includes: a first semiconductor layer formed, on a substrate, of a nitride semiconductor; a second semiconductor layer formed, on the first semiconductor layer, of a nitride semiconductor; a source electrode formed on the second semiconductor layer; a drain electrode formed on the second semiconductor layer; a metal oxide film formed, between the source electrode and the drain electrode, on the second semiconductor layer; and a gate electrode formed on the metal oxide film. The metal oxide film includes $AlO_x$ and $InO_x$. $AlO_x/InO_x$ in the metal oxide film is greater than or equal to 3.

The object and advantages of the invention will be realized and attained by means of the elements and combinations particularly pointed out in the claims. It is to be understood that both the foregoing general description and the following detailed description are exemplary and explanatory and are not restrictive of the invention.

DESCRIPTION OF EMBODIMENT

Figure 1:
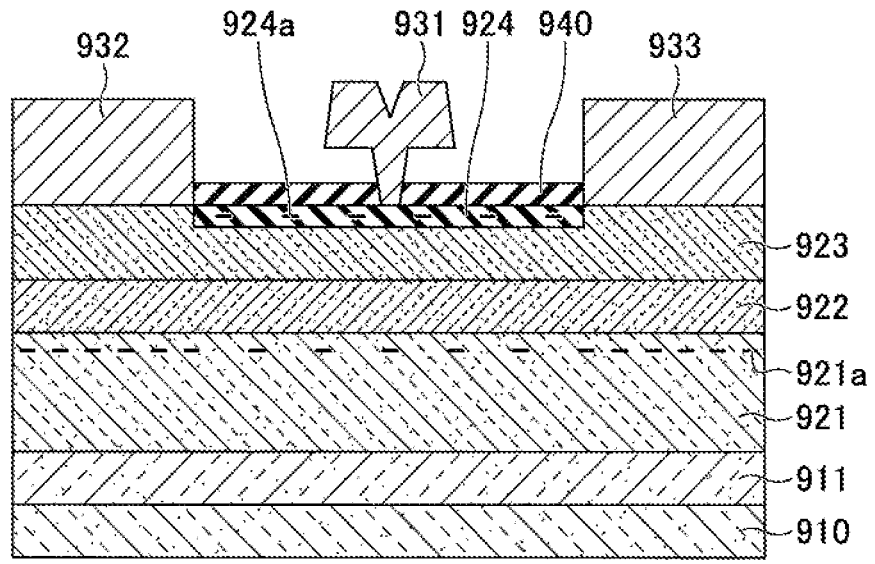
FIG. 1 is a diagram illustrating a structure of a semiconductor device in which an electron supply layer is formed of InAlN.

In the following, embodiments will be described. Note that the same reference numerals are assigned to the same members, and their description may be omitted.

An object in one aspect of the embodiments is to provide, in a HEMT using InAlN for an electron supply layer, a semiconductor device with which a drain current does not decrease.

First Embodiment

First, a decrease of a drain current in a semiconductor device using InAlN for an electron supply layer will be described with reference to FIG. 1.

As illustrated in FIG. 1, a semiconductor device has a buffer layer 911, an electron transport layer 921, a spacer layer 922, and an electron supply layer 923, which are stacked on a substrate 910 and formed by epitaxial growth of nitride semiconductors. The substrate 910 is formed of a material such as SiC. The buffer layer 911 is formed of a material such as AlN or AlGaN. The electron transport layer 921 is formed of i-GaN. The spacer layer 922 is formed of AlN. The electron supply layer 923 is formed of InAlN. With this structure, in the electron transport layer 921, two-Dimensional Electron Gas (2DEG) 921a is generated in the vicinity of the interface between the electron transport layer 921 and the spacer layer 922.

A gate electrode 931, a source electrode 932, and a drain electrode 933 are formed on the electron supply layer 923. Further, a protective film 940 is formed on an area of the electron supply layer 923 on which the gate electrode 931, the source electrode 932, and the drain electrode 933 are not formed. The protective film 940 is formed of a material such as SiN.

In the semiconductor device having such a structure, in a process after the electron supply layer 923 is formed and before the gate electrode 931 and the protective film 940 are formed, an exposed part of the electron supply layer 923 is oxidized and thus a metal oxide film 924 is formed. Accordingly, the gate electrode 931 and the protective film 940 are formed on the metal oxide film 924 in practice. The metal oxide film 924 is a film in which InAlN is oxidized, and includes a large quantity of $InO_x$. As described above, because $InO_x$ included in the metal oxide film 924 formed by oxidation of InAlN is chemically unstable, an oxygen defect is likely to occur. When an electron 924a is trapped in an oxygen defect in $InO_x$, a concentration of the 2DEG decreases in response to this. As a result, current collapse occurs and a drain current decreases.

The inventors have examined oxidation of InAlN and found that the current collapse can be inhibited by oxidizing InAlN with water vapor rather than oxidizing InAlN with oxygen. The embodiments are based on knowledge found by the inventors as described above.

(Semiconductor Device)

Next, a semiconductor device according to a first embodiment will be described with reference to FIG. 2.

The semiconductor device according to the first embodiment has a buffer layer 11, an electron transport layer 21, a spacer layer 22, and an electron supply layer 23, which are stacked on a substrate 10 and formed by epitaxial growth of nitride semiconductors. The substrate 10 is formed of a material such as SiC. The buffer layer 11 is formed of a material such as AlN or GaN. The electron transport layer 21 is formed of i-GaN. The spacer layer 22 is formed of AlN. The electron supply layer 23 is formed of InAlN. Thus, in the electron transport layer 21, 2DEG 21a is generated in the vicinity of the interface between the electron transport layer 21 and the spacer layer 22. Note that the electron supply layer 23 may be a layer formed of InAlGaN. In other words, the electron supply layer 23 may be formed of a material including InAlN or InAlGaN. In this application, the electron transport layer 21 may be referred to as a first semiconductor layer and the electron supply layer 23 may be referred to as a second semiconductor layer. The first semiconductor layer may include the buffer layer 11, the electron transport layer 21, and the spacer layer 22.

A source electrode 32 and a drain electrode 33 are formed on the electron supply layer 23. On a surface in an area of the electron supply layer 23, where the source electrode 32 and the drain electrode 33 are not formed, a metal oxide film 24 is formed. The metal oxide film 24 is formed by oxidizing the area of the electron supply layer 23 with water vapor. A gate electrode 31 is formed on the metal oxide film 24. On an area of the metal oxide film 24, where the gate electrode 31 is not formed, a protective film 40 is formed. The protective film 40 is formed of a material such as SiN. Note that in this application, the protective film 40 may be referred to as an insulation film.

Next, a case of thermally oxidizing InAlN and a case of oxidizing InAlN with water vapor (steam) will be described. Note that $In_{0.18}Al_{0.82}N$ is used as InAlN so as to lattice match with GaN. Both the thermal oxidation and the steam oxidation of $In_{0.18}Al_{0.82}N$ are performed for 30 minutes at a temperature of 300° C. It is considered that the metal oxide film 924, formed in the semiconductor device illustrated in FIG. 1, is formed through thermal oxidation because the metal oxide film 924 is formed in a production process after the electron supply layer 923 is deposited (formed). That is, it is considered that the metal oxide film 924 is formed by oxidation by oxygen.

Figure 3:
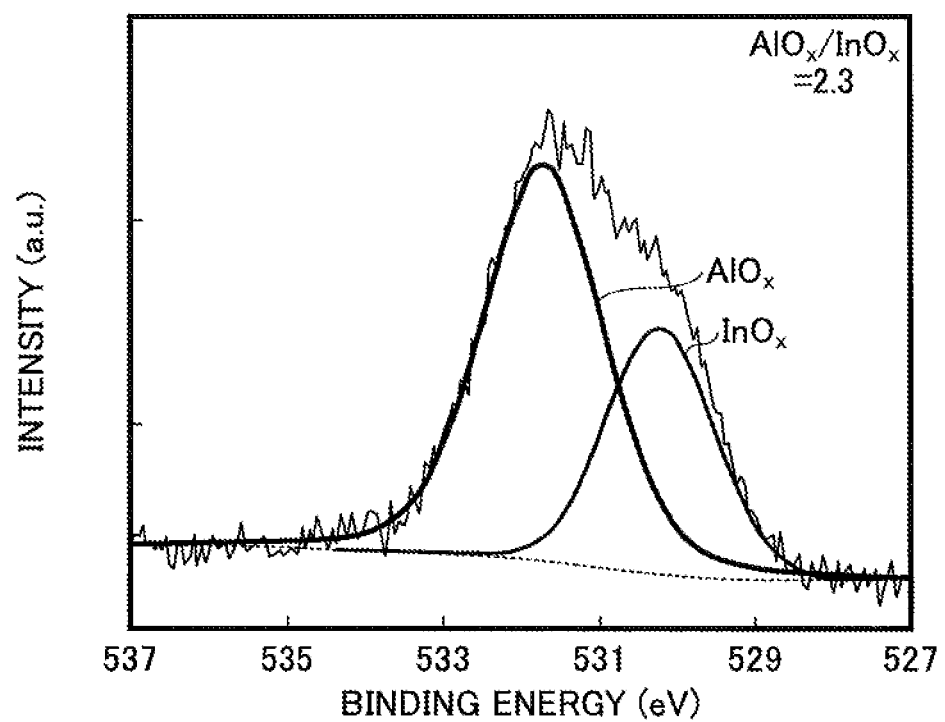
FIG. 3 is a graph illustrating characteristics, analyzed by XPS, of a film formed by oxidizing $In_{0.18}Al_{0.82}$ with oxygen.
Figure 4:
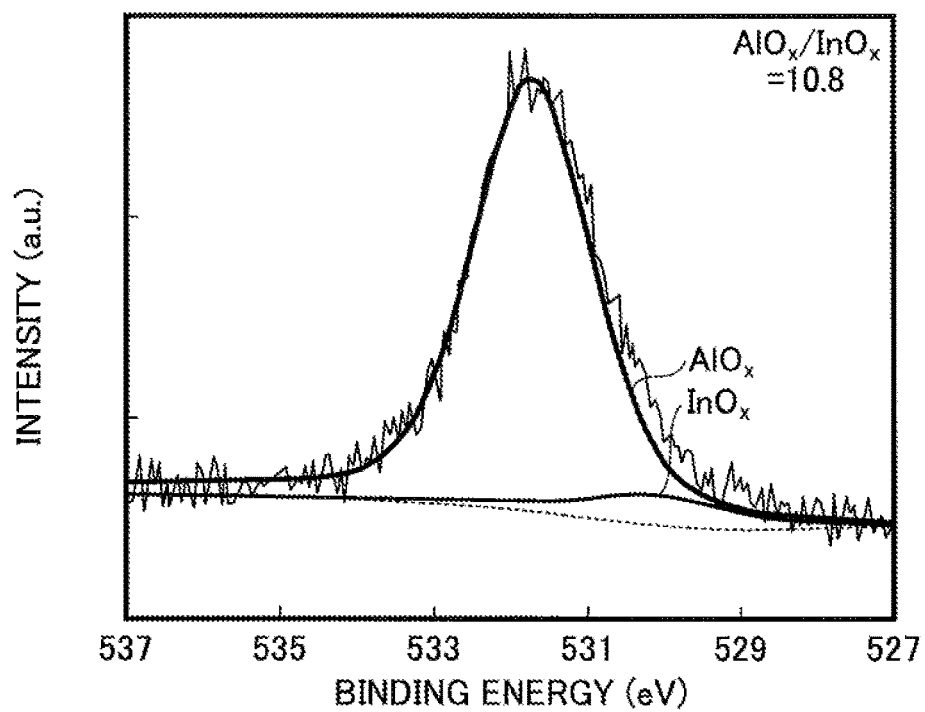
FIG. 4 is a graph illustrating characteristics, analyzed by XPS, of a film formed by oxidizing $In_{0.18}Al_{0.82}$ with water vapor.

FIG. 3 is a result of analyzing, by X-ray Photoelectron Spectroscopy (XPS), the metal oxide film formed by thermally oxidizing $In_{0.18}Al_{0.82}$. FIG. 4 is a result of analyzing, by XPS, the metal oxide film formed by oxidizing $In_{0.18}Al_{0.82}$ with water vapor. A detection angle of the XPS in FIG. 3 and FIG. 4 is 15°. Information on a surface layer of a film can be accurately obtained when the detection angle of the XPS is a low angle rather than a high angle. A value of $AlO_x/InO_x$ of the metal oxide film, formed by thermally oxidizing $In_{0.18}Al_{0.82}$ illustrated in FIG. 3, is 2.3. A value of $AlO_x/InO_x$ of the metal oxide film, formed by oxidizing $In_{0.18}Al_{0.82}$ with water vapor illustrated in FIG. 4, is 10.8. Accordingly, the ratio of $AlO_x$ with respect to $InO_x$ can be increased by oxidizing $In_{0.18}Al_{0.82}$ with water vapor in comparison with a case of thermally oxidizing $In_{0.18}Al_{0.82}$. For $AlO_x$, an insulation property is high and a defect is less likely to occur in comparison with $InO_x$. Therefore, by increasing the ratio of $AlO_x$ with respect to $InO_x$ in the metal oxide film, it is possible to inhibit current collapse and to inhibit a decrease of the drain current. According to the semiconductor device in the embodiment, because the metal oxide film is formed by oxidizing $In_{0.18}Al_{0.82}$ with water vapor, it is possible to inhibit the current collapse and to inhibit decreasing of the drain current.

Here, $AlO_x/InO_x$ indicates a ratio of the number of $AlO_x$ with respect to the number of $InO_x$. In other words, $AlO_x/InO_x$ indicates a ratio of Al atoms with respect to In atoms in a metal oxide film. Note that one or more kinds of aluminum oxide and one or more kinds of indium oxide may be included in the metal oxide film.

Next, reaction processes of thermal oxidation and water vapor oxidation of metal will be described. In a case where metal (M) is thermally oxidized with oxygen ($O_2$), the metal is directly oxidized by oxygen as indicated in the following formula 1.

$$4M + 3O_2 \rightarrow 2M_2O_3 \qquad \text{<Formula 1>}$$

(M: Metal)

On the other hand, in a case where metal (M) is oxidized with water vapor ($H_2O$), after the metal hydroxide is generated, the oxide is generated from the metal hydroxide as indicated in the following formula 2.

$$2M + 6H_2O \rightarrow 2M(OH)_3 + 3H_2$$

$$2M(OH)_3 \rightarrow M_2O_3 + 3H_2O \qquad \text{<Formula 2>}$$

(M: Metal)

Note that in a case where the metal (M) is In, $In(OH)_x$ sublimates at a temperature of 150° C. In a case where the metal (M) is Al, $Al(OH)_x$ becomes $AlO_x$ at a temperature of 300° C. Accordingly, in a case where InAlN is oxidized with water vapor at a temperature of 300° C., $In(OH)_x$ and $Al(OH)_x$ are generated first, but at this temperature, $In(OH)_x$ sublimates and $Al(OH)_x$ becomes $AlO_x$. Therefore, because In becomes $In(OH)_x$, sublimates, and decreases in the process of steam oxidation, the ratio of Al with respect to In increases in the metal oxide film formed by oxidizing $In_{0.18}Al_{0.82}$ with water vapor. Thus, it is considered that, when the metal oxide film is formed by oxidizing $In_{0.18}Al_{0.82}$ with water vapor, $AlO_x/InO_x$ is 10.8, which is high. As described above, in the metal oxide film, as the ratio of $AlO_x$ increases, defects decrease and electron traps are reduced. Therefore, decreasing of the drain current can be prevented.

Note that $AlO_x/InO_x$ in the metal oxide film formed by thermally oxidizing $In_{0.28}Al_{0.82}$ is 2.3, which is lower than Al/In in $In_{0.18}Al_{0.82}N$ before oxidized, which is about 4.6. Here, because In is more easily oxidized than the Al included in $In_{0.18}Al_{0.82}N$, it is estimated that, in a state of not being oxidized sufficiently, a proportion of $InO_x$ generated as oxide of In is higher than a proportion of $AlO_x$ generated as oxide of Al.

Therefore, according to the embodiment, the value of $AlO_x/InO_x$ in the metal oxide film 24 is preferably greater than or equal to 3. Further, the value of $AlO_x/InO_x$ in the metal oxide film 24 is preferably greater than or equal to the value of Al/In in $In_{0.18}Al_{0.82}N$, and for example, is greater than or equal to 4.6, and especially preferably greater than or equal to 10. In other words, it is preferable that the value of $AlO_x/InO_x$ in the metal oxide film 24 is greater than or equal to the value of Al/In in the electron supply layer 23. Note that when $In_{0.18}Al_{0.82}N$ is oxidized with water vapor, because In becomes $In(OH)x$ and sublimates, the value of $AlO_x/InO_x$ in the metal oxide film 24 becomes higher than the value of Al/In in $In_{0.18}Al_{0.82}N$ before being oxidized with water vapor.

Further, according to the embodiment, it is preferable that, when InAlN is oxidized by water vapor (steam), the temperature of the water vapor oxidation is greater than or equal to 300° C. in order to efficiently sublimate $In(OH)_x$ generated and to efficiently obtain $AlO_x$ from $Al(OH)_x$. Further, the temperature of the water vapor oxidation is preferably less than or equal to 800° C., and more preferably less than or equal to 500° C. because In losses occur in the electron supply layer 23 when the temperature is excessively high.

Figure 5:
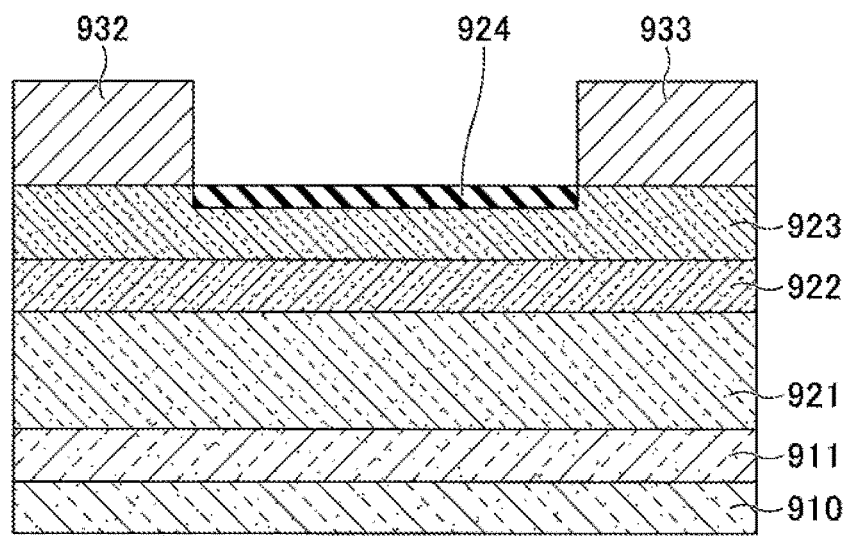
FIG. 5 is a diagram illustrating a structure of a sample 5A in which a film oxidized by oxygen is formed on a surface of an electron supply layer.
Figure 6:
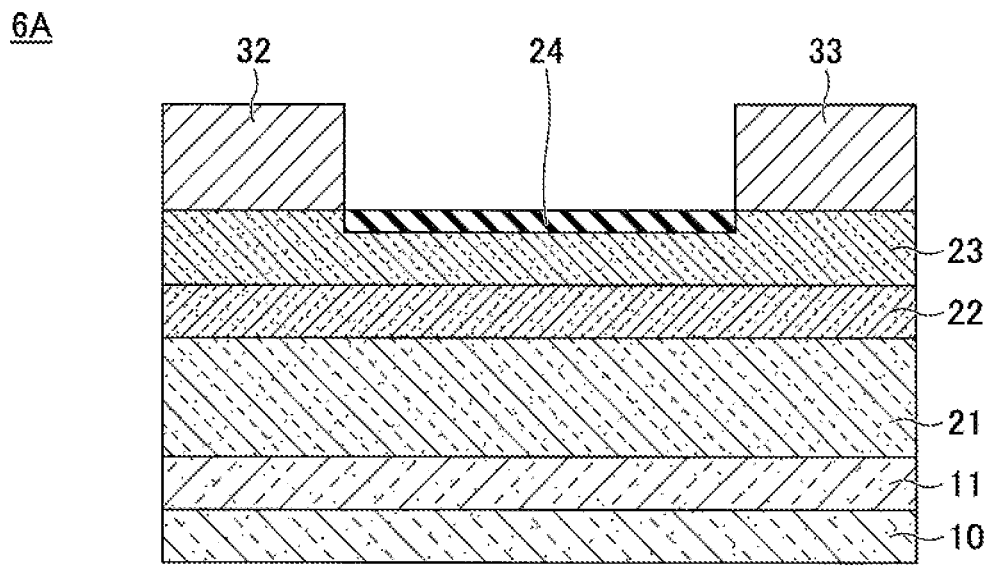
FIG. 6 is a diagram illustrating a structure of a sample 6A in which a film oxidized by water vapor is formed on a surface of an electron supply layer.
Figure 7:
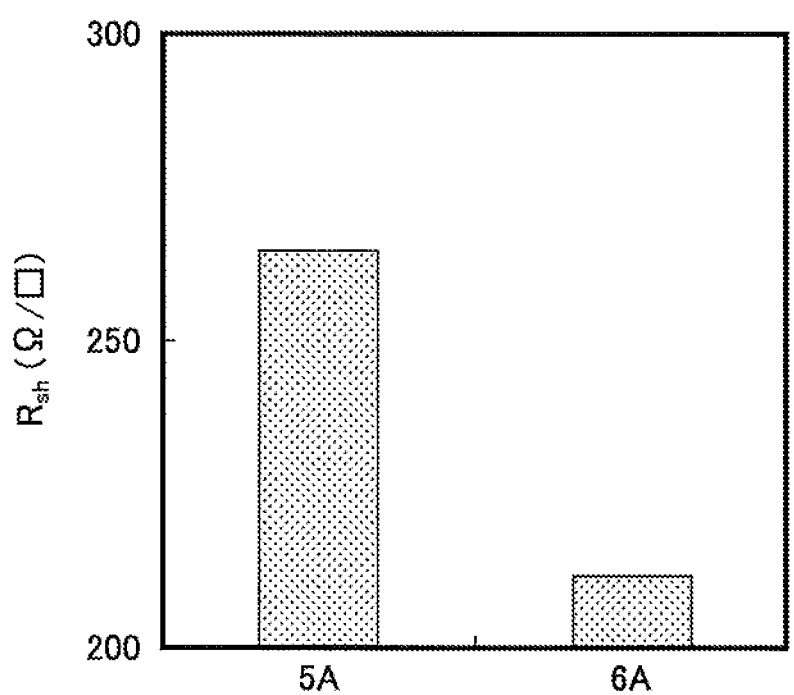
FIG. 7 is a graph illustrating a sheet resistance of the sample 5A and a sheet resistance of the sample 6A.

Next, a sample 5A, in which an oxidation film is formed by thermally oxidizing $In_{0.18}Al_{0.82}N$ illustrated in FIG. 5, and a sample 6A, in which an oxidation film is formed by oxidizing $In_{0.18}Al_{0.82}N$ with water vapor illustrated in FIG. 6, are prepared. Then, sheet resistances in 2DEGs of the respective samples 5A and 6A are measured. FIG. 7 illustrates this measured result. The sheet resistances are measured by applying voltage between the source electrode and the drain electrode.

Note that the sample 5A illustrated in FIG. 5 corresponds to a configuration, in which the gate electrode 931 and the protective film 940 are not formed in the semiconductor device illustrated in FIG. 1. The sample 6A illustrated in FIG. 6 corresponds to a configuration, in which the gate electrode 31 and the protective film 40 are not formed in the semiconductor device according to the first embodiment illustrated in FIG. 2. Note that in the respective samples 5A and 6A, the electron supply layers are formed of $In_{0.18}Al_{0.82}N$, and $In_{0.18}Al_{0.82}N$ is oxidized for 30 minutes at a temperature of 300° C.

As a result, the sheet resistance of the sample 6A is lower than that of the sample 5A as illustrated in FIG. 7. Therefore, electrons trapped in a metal oxide film can be reduced and a decrease in a density of 2DEG can be inhibited by the configuration having the metal oxide film formed by oxidizing $In_{0.18}Al_{0.82}N$ with water vapor in comparison with the configuration having the metal oxide film formed by thermally oxidizing $In_{0.18}Al_{0.82}N$. That is, the current collapse can be inhibited and the decrease of the drain current can be inhibited by the configuration having the metal oxide film formed by oxidizing $In_{0.18}Al_{0.82}N$ with water vapor in comparison with the configuration having the metal oxide film formed by thermally oxidizing $In_{0.18}Al_{0.82}N$.

Figure 2:
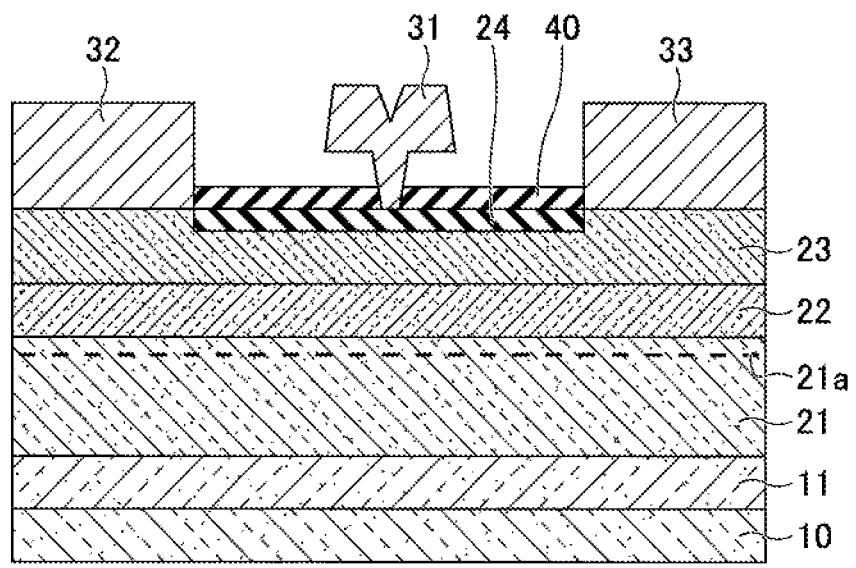
FIG. 2 is a diagram illustrating a structure of a semiconductor device according to a first embodiment.
Figure 8:
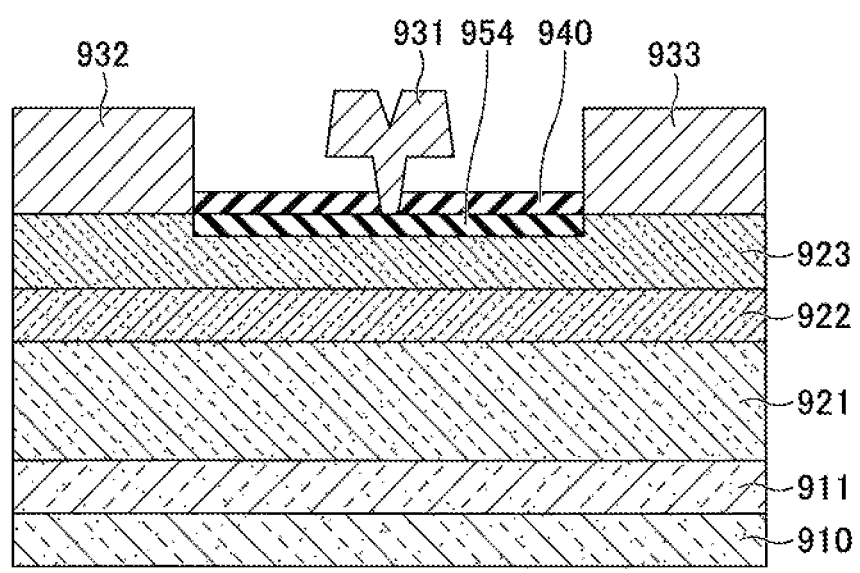
FIG. 8 is a diagram illustrating a structure of a semiconductor device used for comparison.
Figure 9:
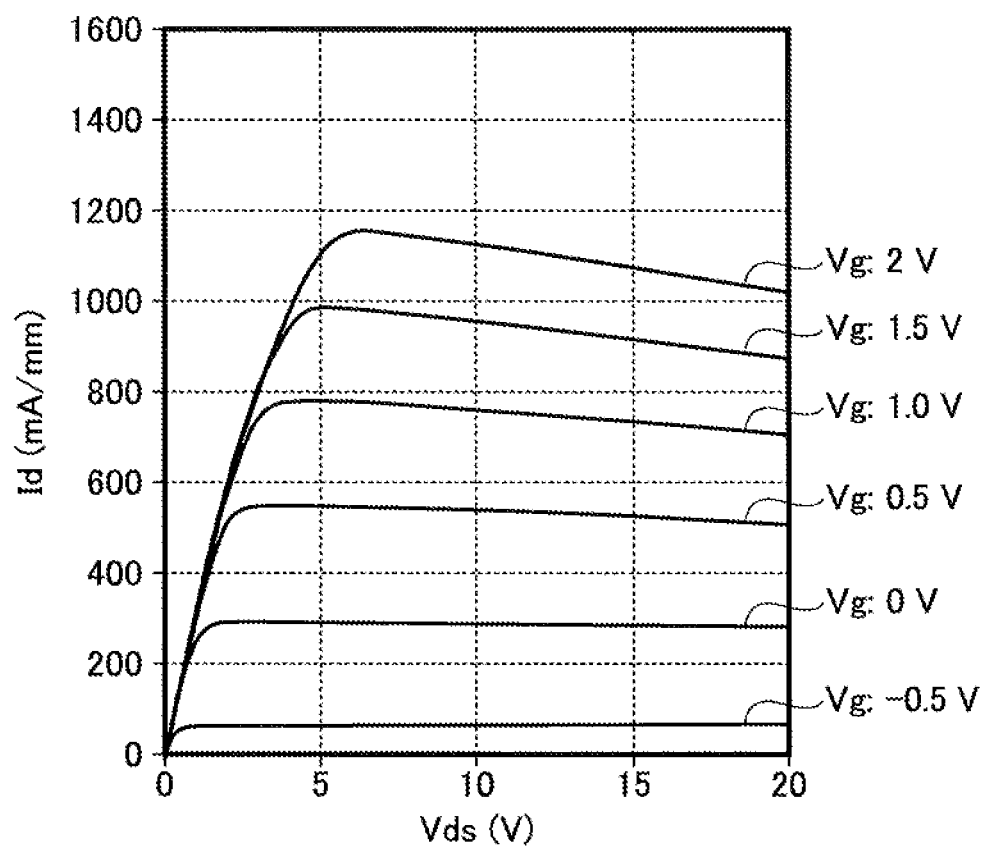
FIG. 9 is a graph illustrating Vds-Id characteristics of the semiconductor device having the structure illustrated in FIG. 8.
Figure 10:
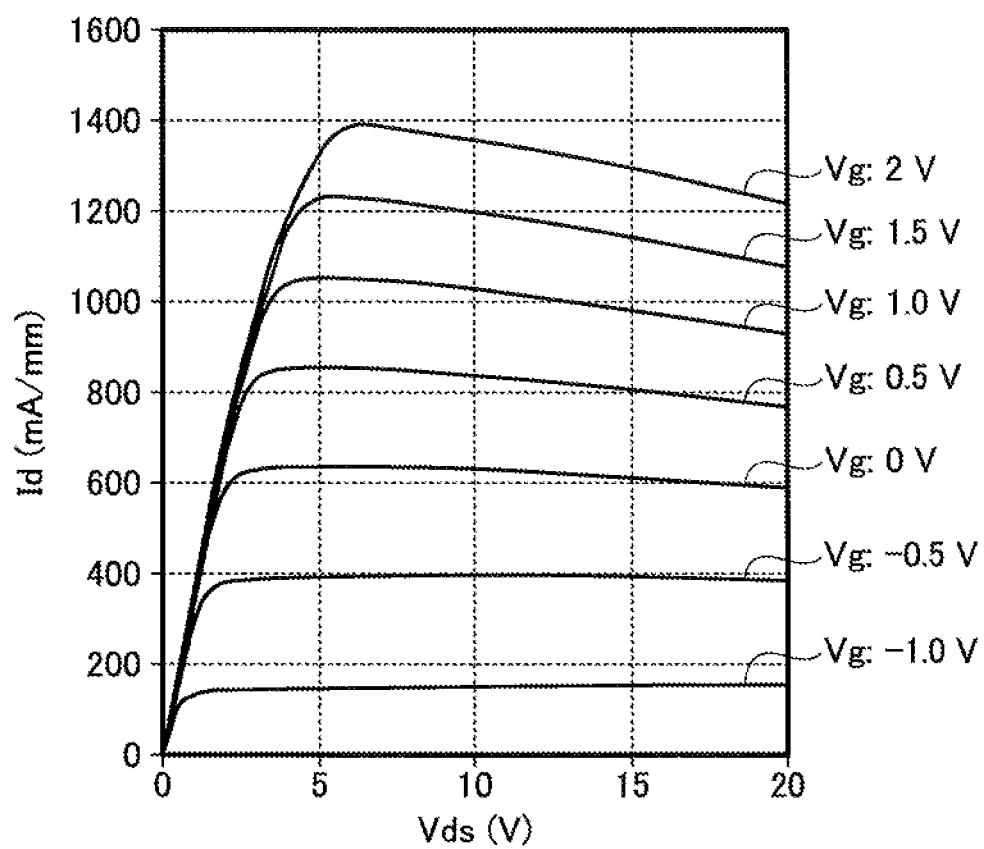
FIG. 10 is a graph illustrating Vds-Id characteristics of the semiconductor device according to the first embodiment.

Next, a semiconductor device illustrated in FIG. 8 having a metal oxide film 954 formed by thermal oxidation similar to the semiconductor device illustrated in FIG. 1 and the semiconductor device according to the first embodiment illustrated in FIG. 2 are prepared to describe a result of measuring a relationship between Vds (drain-source voltage) and Id (drain current). Note that the metal oxide film 954 of the semiconductor device having the structure illustrated in FIG. 8 is formed by thermally oxidizing the surface of $In_{0.18}Al_{0.82}N$ for 30 minutes at a temperature of 300° C. The metal oxide film 24 of the semiconductor device according to the embodiment illustrated in FIG. 2 is formed by oxidizing the surface of $In_{0.18}Al_{0.82}N$ with water vapor for 30 minutes at a temperature of 300° C. FIG. 9 illustrates a relationship between Vds and Id in a case where Vg (gate voltage) is changed in the semiconductor device having the structure illustrated in FIG. 8. FIG. 10 illustrates a relationship between Vds and Id in a case where Vg (gate voltage) is changed in the semiconductor device according to the first embodiment illustrated in FIG. 2.

As illustrated in FIG. 9 and FIG. 10, when Vg (gate voltage) is the same, drain current (Id) flows more in the semiconductor device according to the first embodiment illustrated in FIG. 2 than in the semiconductor device having the structure illustrated in FIG. 8. From FIG. 9 and FIG. 10, on-resistance (Ron) when Vg is 2V in the semiconductor device having the structure illustrated in FIG. 8 is 3.27 Ω·mm, and on-resistance when Vg is 2V in the semiconductor device according to the first embodiment illustrated in FIG. 2 is 2.65 Ω·mm. Thus, the semiconductor device according to first the embodiment can decrease the on-resistance more than the semiconductor device having the structure illustrated in FIG. 8.

As described above, in the semiconductor device having the structure illustrated in FIG. 8, the metal oxide film 954, which is formed by thermally oxidizing $In_{0.18}Al_{0.82}N$, is formed on the surface of the electron supply layer 923 and electrons are trapped in a large quantity of $InO_x$ included in the metal oxide film 954. Thus, a current collapse is generated by the electrons trapped in the metal oxide film 954, the on-resistance increases, and the drain current decreases. In contrast, in the semiconductor device according to the first embodiment illustrated in FIG. 2, the metal oxide film 24, which is formed by oxidizing $In_{0.18}Al_{0.82}N$ with water vapor, is formed on the surface of the electron supply layer 23. Accordingly, because $InO_x$ included in the metal oxide film 24 is fewer than in the metal oxide film 954 formed by thermal oxidation, electrons trapped in the metal oxide film 24 are also few. Thus, according to the semiconductor device of the embodiment, current collapse is inhibited, on-resistance is low, and a decrease of the drain current is inhibited.

Further, in the semiconductor device according to the embodiment, the metal oxide film 24 is formed by oxidizing InAlN with water vapor. Thus, in comparison with the metal oxide film formed by thermal oxidation, the metal oxide film 24 according to the embodiment contains a large quantity of $AlO_x$, whose insulation property is high. Therefore, a gate-leak current can be inhibited.

(Method for Producing Semiconductor Device)

Next, a method for producing the semiconductor device according to the first embodiment will be described with reference to FIG. 11 and FIG. 12.

Figure 11A:
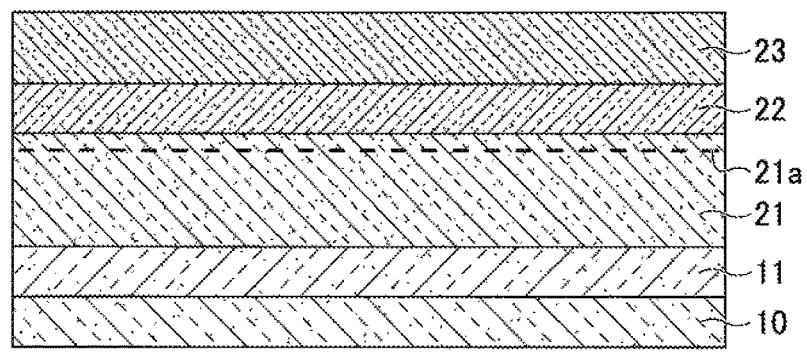
FIGS. 11A to 11C are diagrams illustrating processes (1) of a method for producing the semiconductor device according to the first embodiment.

First, as illustrated in FIG. 11A, on the substrate 10, the buffer layer 11, the electron transport layer 21, the spacer layer 22, and the electron supply layer 23 are formed by causing nitride semiconductor layers to epitaxially grow. Thereby, in the electron transport layer 21, the 2DEG 21a is generated in the vicinity of the interface between the electron transport layer 21 and the spacer layer 22. The nitride semiconductor layers are formed by epitaxial growth through Metal Organic Vapor Phase Epitaxy (MOVPE). Note that these nitride semiconductor layers may be formed by Molecular Beam Epitaxy (MBE) instead of MOVPE. On the electron supply layer 23, a gap layer, formed of a material such as GaN, may be formed (not illustrated).

For example, a sapphire substrate, a Si substrate, a SiC substrate, or a GaN substrate may be used as the substrate 10. According to the embodiment, a SiC substrate is used as the substrate 10. The buffer layer 11 is formed of a material such as AlGaN. The electron transport layer 21 is formed of i-GaN. The spacer layer 22 is formed of AlN. The electron supply layer 23 is formed of $In_{0.18}Al_{0.82}N$.

When these nitride semiconductor layers are deposited (formed) through MOVPE, trimethyl indium (TMI) is used as a material gas of In, trimethyl aluminum (TMA) is used as a material gas of Al, and trimethyl gallium (TMG) is used as a material gas of Ga. $NH_3$ (ammonia) is used as a material gas of N. These material gases are supplied to a reacting furnace of a MOVPE apparatus using hydrogen ($H_2$) as a carrier gas.

Subsequently, an element isolation area for isolating an element is formed (not illustrated). Specifically, a photoresist is applied on the electron supply layer 23, and the photoresist is exposed by an exposure apparatus and developed to form a resist pattern having an opening at an area where the element isolation area is to be formed. Subsequently, Argon (Ar) ions are injected into the nitride semiconductor layer of the area, in which the resist pattern is not formed, to form the element isolation area. The element isolation area may be formed by removing, through dry etching such as Reactive Ion Etching (RIE), a part of the nitride semiconductor layer of the area in which the resist pattern is not formed. After the element isolation area is formed, the resist pattern is removed by an organic solvent or the like.

Figure 11B:
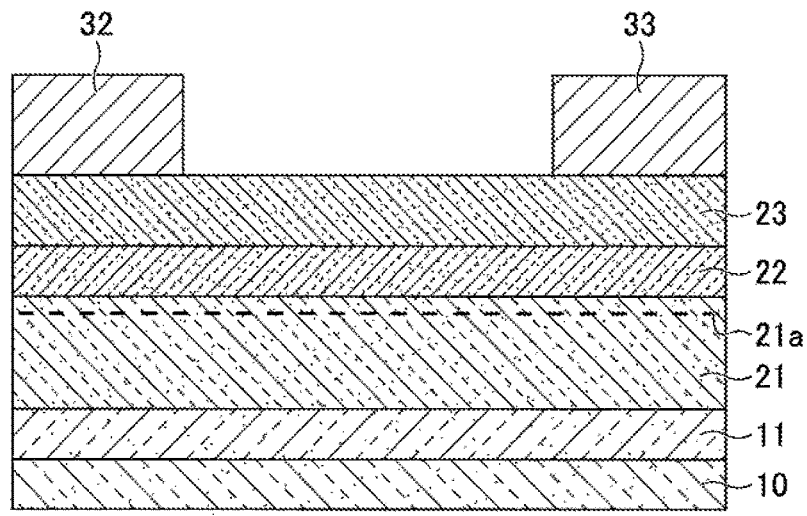

Next, as illustrated in FIG. 11B, the source electrode 32 and the drain electrode 33 are formed on the electron supply layer 23. Specifically, a photoresist is applied on the electron supply layer 23, and the photoresist is exposed by the exposure apparatus and developed to form a resist pattern (not illustrated) having an opening at respective areas where the source electrode 32 and the drain electrode 33 are to be formed. Subsequently, after stacked metal films, which are formed of Ti/Al, are deposited (formed) by vacuum deposition, the stacked metal films that are formed on the resist pattern are immersed in an organic solvent. Thereby, the stacked metal films are removed together with the resist pattern through lift-off processing. In this way, the remaining stacked metal films form the source electrode 32 and the drain electrode 33. Note that the stacked metal films formed of Ti/Al are a Ti film and an Al film that are formed on the electron supply layer 23 in this order. Subsequently, a heat treatment is performed at a temperature from 400° C. to 800° C. in a nitrogen atmosphere to cause the source electrode 32 and the drain electrode 33 to make an ohmic contact.

Figure 11C:
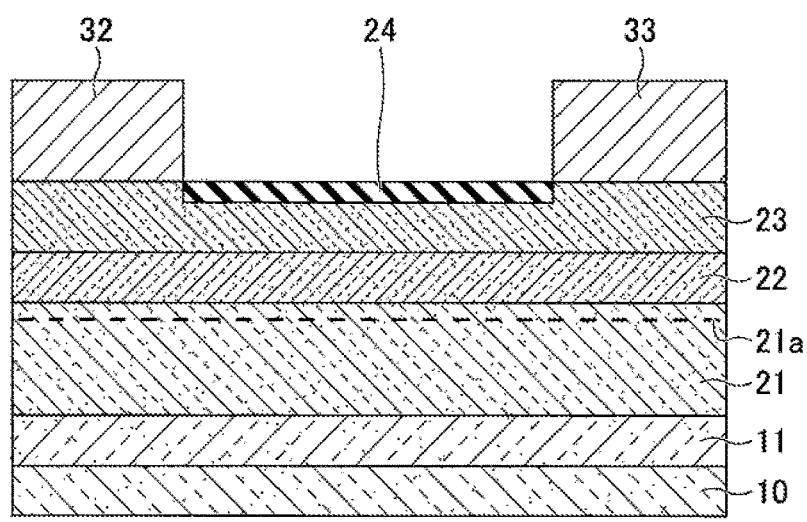

Next, as illustrated in FIG. 11C, the exposed surface of $In_{0.18}Al_{0.82}N$ forming the electron supply layer 23 is oxidized with water vapor to form the metal oxide film 24. Specifically, water vapor at a temperature of from 300° C. to 500° C. is used to oxidize $In_{0.1}Al_{0.82}N$, exposed to the surface, to form the metal oxide film 24. At this time, it is preferable to perform the process of water vapor oxidation in a vacuum in order to promote sublimation of $In(OH)_x$ generated. The film thickness of the metal oxide film 24 formed by oxidizing $In_{0.18}Al_{0.82}N$ with water vapor as described above is about 2 nm. Here, $In_{0.18}Al_{0.82}N$ is not very deeply oxidized in the water vapor oxidation. Therefore, the film thickness of the metal oxide film 24, formed by using water vapor at a temperature from 300° C. to 500° C. to oxidize $In_{0.18}Al_{0.82}N$, is less than or equal to 3 nm. Further, if the water vapor oxidation of $In_{0.18}Al_{0.82}N$ is insufficient, the film thickness of the metal oxide film is thin and a proportion of remaining $InO_x$ is large. Therefore, according to the embodiment, it is preferable that the film thickness of the metal oxide film 24 is greater than or equal to 1 nm and less than or equal to 3 nm.

Figure 12A:
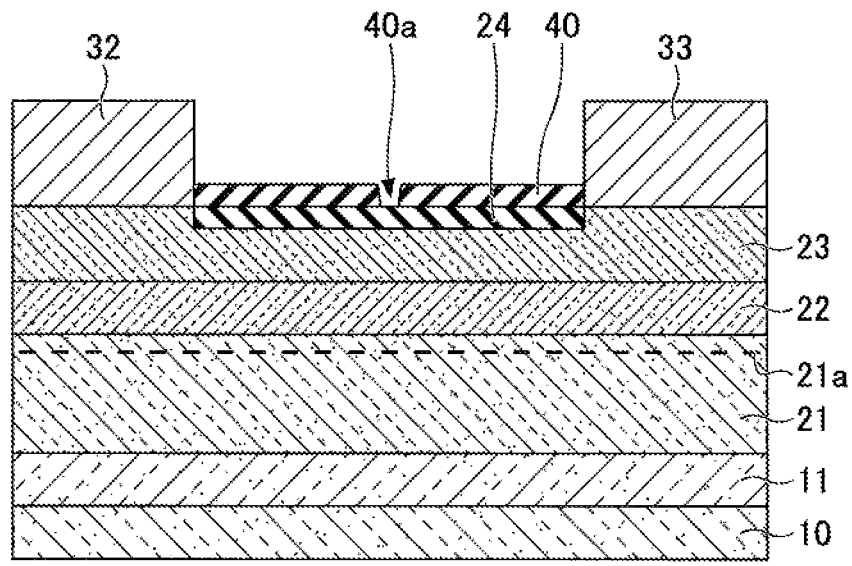
FIGS. 12A and 12B are diagrams illustrating processes (2) of the method for producing the semiconductor device according to the first embodiment.

Next, as illustrated in FIG. 12A, the protective film 40 having an opening portion 40a is formed at an area where the gate electrode 31 is to be formed on the metal oxide film 24. Specifically, a SiN film, of which the film thickness is from 10 nm to 100 nm, is deposited (formed) through plasma chemical vapor deposition (CVD) or the like. Subsequently, a photoresist is applied on the SiN film, and the photoresist is exposed by the exposure apparatus and developed to form a resist pattern (not illustrated) having an opening at an area where the gate electrode 31 is to be formed. Subsequently, the metal oxide film 24 is exposed by removing the SiN film, exposed at the opening of the resist pattern, through dry etching such as RIE using fluorine gas as etching gas. In this way, the protective film 40 having the opening portion 40a is formed at the area where the gate electrode 31 is to be formed. Subsequently, the resist pattern (not illustrated) is removed by an organic solvent or the like. Note that, according to the embodiment, the protective film 40 may be formed of a material such as $Al_2O_3$, $HfO_2$, $SiO_2$, SiON, AlN, or AlON instead of SiN.

Figure 12B:
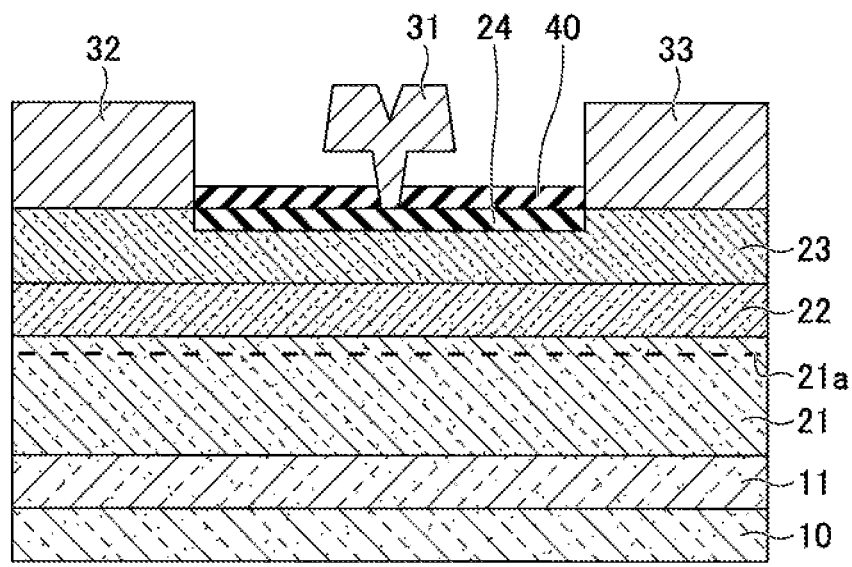

Next, as illustrated in FIG. 12B, the gate electrode 31 is formed on the metal oxide film 24 exposed at the opening portion 40a of the protective film 40. Specifically, a photoresist is applied on the protective film 40, the electron supply layer 23, the source electrode 32, and the drain electrode 33, and the photoresist is exposed by the exposure apparatus and developed to form a resist pattern (not illustrated) having an opening at an area where the gate electrode 31 is to be formed. Subsequently, after stacked metal films, which are formed of Ni/Au, are deposited (formed) by vacuum deposition, the stacked metal films that are formed on the resist pattern are immersed in an organic solvent. Thereby, the stacked metal films are removed together with the resist pattern through lift-off processing. In this way, the remaining stacked metal films form the gate electrode 31. Note that the stacked metal films formed of Ni/Au are a Ni film and an Au film that are formed on the electron supply layer 23 in this order.

The semiconductor device according to the first embodiment can be produced through the above described processes.

Second Embodiment (Semiconductor Device)

Next, a semiconductor device according to a second embodiment will be described with reference to FIG. 13.

Figure 13:
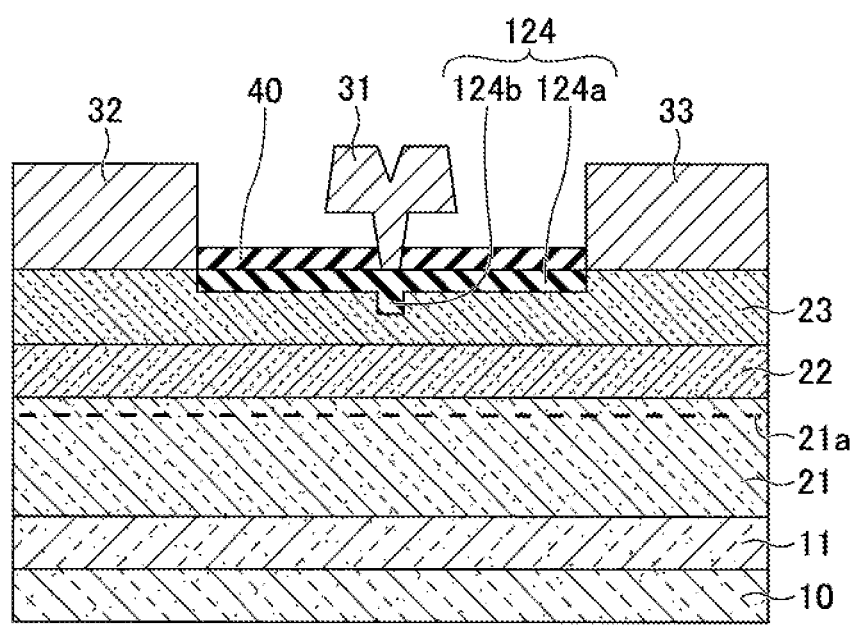
FIG. 13 is a diagram illustrating a structure of a semiconductor device according to a second embodiment.

As illustrated in FIG. 13, the semiconductor device according to the second embodiment is a semiconductor device having a structure, in which a metal oxide film 124 is formed. In the metal oxide film 124, a film thickness of an area located immediately below the gate electrode 31 is thicker than a film thickness of other areas. The metal oxide film 124 is formed by a first oxidized area 124a and a second oxidized area 124b. The first oxidized area 124a is formed by oxidizing the surface of the electron supply layer 23. The second oxidized area 124b is formed by oxidizing a deeper portion of the electron supply layer 23 than the first oxidized area 124a. A gate-leak current can be further inhibited by thickening the metal oxide film 124 located immediately below the gate electrode 31.

(Method for Producing Semiconductor Device)

Next, a method for producing a semiconductor device according to the second embodiment will be described with reference to FIG. 14 and FIG. 15.

Figure 14A:
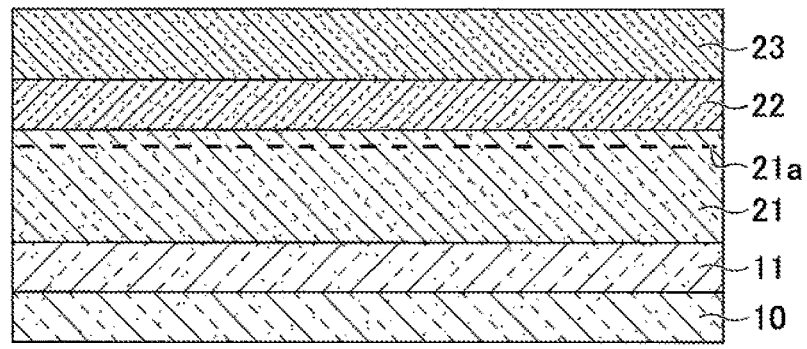
FIGS. 14A to 14C are diagrams illustrating processes (1) of a method for producing the semiconductor device according to the second embodiment.

First, as illustrated in FIG. 14A, on the substrate 10, the buffer layer 11, the electron transport layer 21, the spacer layer 22, and the electron supply layer 23 are formed by causing nitride semiconductor layers to epitaxially grow. Thereby, in the electron transport layer 21, the 2DEG 21a is generated in the vicinity of the interface between the electron transport layer 21 and the spacer layer 22. Subsequently, the element isolation area for isolating the element is formed (not illustrated).

Figure 14B:
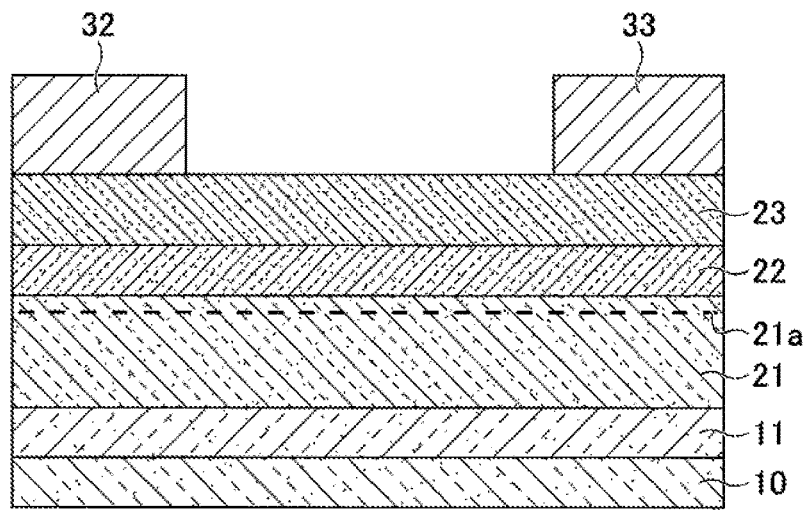

Next, as illustrated in FIG. 14B, the source electrode 32 and the drain electrode 33 are formed on the electron supply layer 23.

Figure 14C:
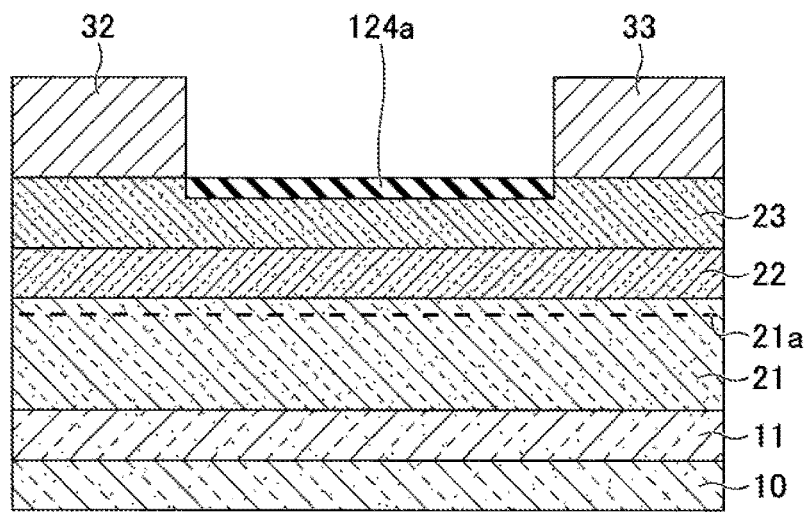

Next, as illustrated in FIG. 14C, the exposed surface of $In_{0.1}Al_{0.82}N$ forming the electron supply layer 23 is oxidized with water vapor to form the first oxidized area 124a. Specifically, water vapor, of which a temperature is greater than or equal to 300° C. and less than 500° C., is used to oxidize $In_{0.1}Al_{0.82}N$, exposed to the surface to form the first oxidized area 124a. At this time, it is preferable to perform the process of water vapor oxidation in a vacuum in order to promote sublimation of $In(OH)_x$ generated. The film thickness of the first oxidized area 124a formed by oxidizing $In_{0.18}Al_{0.82}N$ with water vapor as described above is about 2 nm.

Figure 15A:
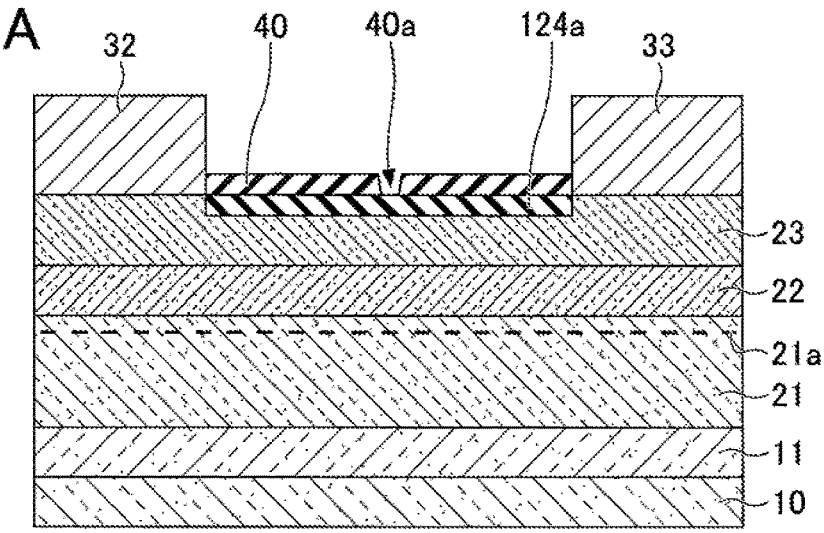
FIGS. 15A to 15C are diagrams illustrating processes (2) of the method for producing the semiconductor device according to the second embodiment.

Next, as illustrated in FIG. 15A, the protective film 40, which has the opening portion 40a at an area where the gate electrode 31 is to be formed, is formed on the first oxidized area 124a.

Figure 15B:
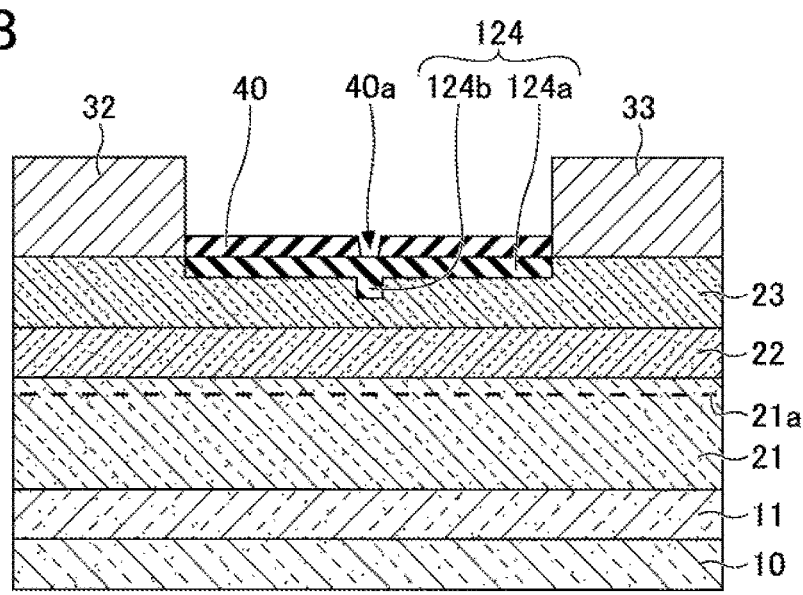

Next, as illustrated in FIG. 15B, at the area where the opening portion 40a of the protective film 40 is formed, a deeper portion of the electron supply layer 23 than the first oxidized area 124a is oxidized to form the second oxidized area 124b. In other words, the second oxidized area 124b, which is deeper than the first oxidized area, is formed by oxidizing with water vapor the second semiconductor layer at the area where the opening portion is formed. The metal oxide film 124 is formed by the second oxidized area 124b and the first oxidized area 124a formed as described above. Specifically, water vapor, of which a temperature is greater than or equal to 500° C. and less than or equal to 800° C., is used to oxidize $In_{0.18}Al_{0.82}N$, forming the electron supply layer 23 at the opening portion 40a of the protective film 40, in order to form the second oxidized area 124b. At the area where the opening portion 40a is not formed, the electron supply layer is not oxidized because the protective film 40 has been formed. However, at the area where the opening portion 40a is formed, oxidation of the electron supply layer 23 progresses due to the opening portion 40a. That is, because the temperature of water vapor is higher than in the case of forming the first oxidized area 124a, at the area where the opening portion 40a of the protective film 40 is formed, water vapor enters deeply through the exposed first oxidized area 124a. Thus, the deeper portion of the electron supply layer 23 than the first oxidized area 124a is oxidized to form the second oxidized area 124b. In this way, it is possible to thicken the film thickness of the metal oxide film 124 at the area where the opening portion 40a of the protective film 40 is formed. In the metal oxide film 124 formed as described above, the film thickness of the area at which the opening portion 40a of the protective film 40 is formed is in a range of from 3 nm to 4 nm, and the film thickness of other areas is about 2 nm.

Figure 15C:
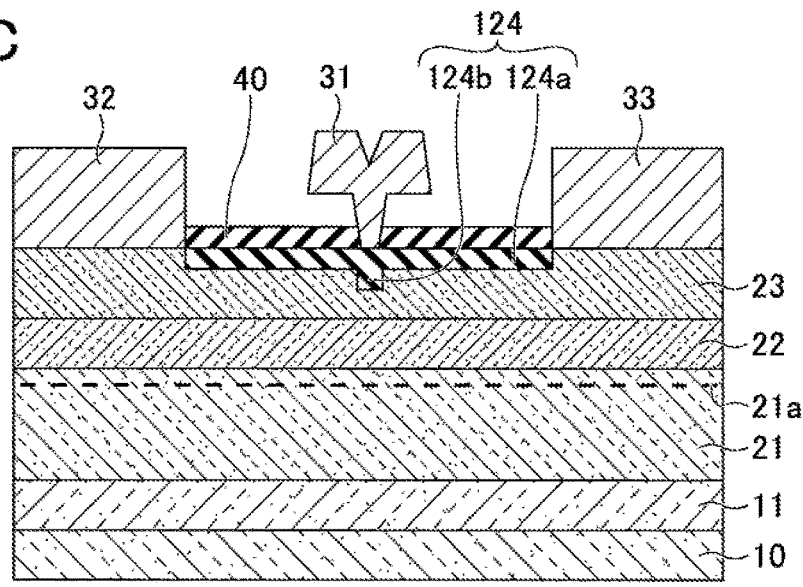

Next, as illustrated in FIG. 15C, the gate electrode 31 is formed on the metal oxide film 124 exposed at the opening portion 40a of the protective film 40. The gate electrode 31 is formed on the area, where the second oxidized area 124b is formed and the film thickness is thick, of the metal oxide film 124. Thus, the film thickness, located immediately below the gate electrode 31, of the metal oxide film 124 is formed to be thick.

The semiconductor device according to the second embodiment can be produced through the above described processes.

Note that other configurations of the second embodiment are similar to those of the first embodiment.

Third Embodiment (Semiconductor Device)

Next, a semiconductor device according to a third embodiment will be described with reference to FIG. 16.

Figure 16:
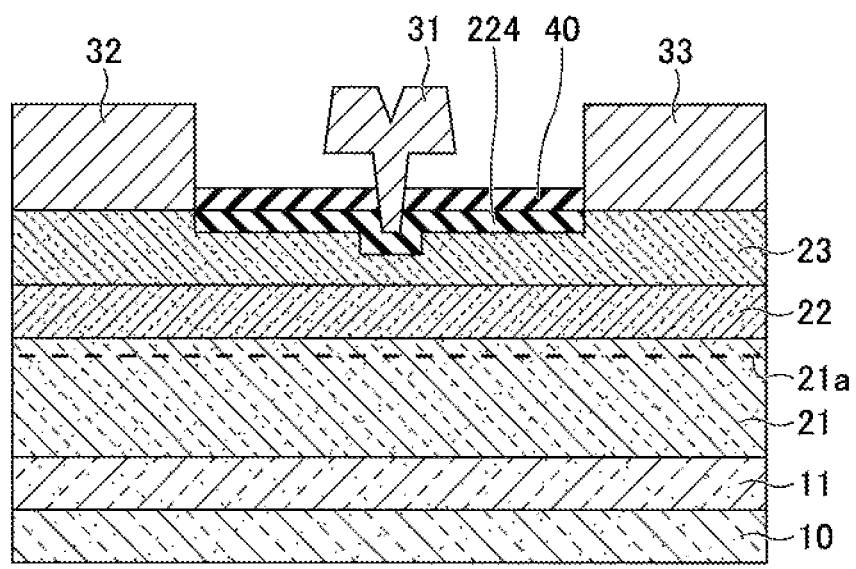
FIG. 16 is a diagram illustrating a structure of a semiconductor device according to a third embodiment.

As illustrated in FIG. 16, the semiconductor device according to the third embodiment is a semiconductor device having a structure, in which a gate recess is formed on the electron supply layer 23 and a metal oxide film 224 is formed by oxidizing, with water vapor, the surface of the electron supply layer 23 where the gate recess is formed. The gate recess is formed on the electron supply layer 23 and the gate electrode is formed on the gate recess so that the gate voltage is made closer to normally-off.

(Method for Producing Semiconductor Device)

Next, a method for producing the semiconductor device according to the third embodiment will be described with reference to FIG. 17 and FIG. 18.

Figure 17A:
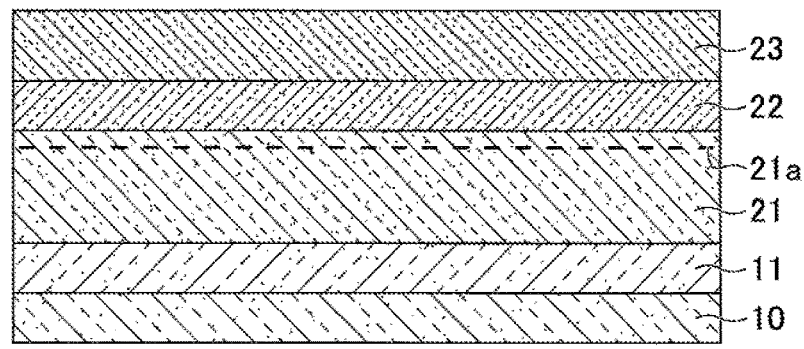
FIGS. 17A to 17C are diagrams illustrating processes (1) of a method for producing the semiconductor device according to the third embodiment.

First, as illustrated in FIG. 17A, on the substrate 10, the buffer layer 11, the electron transport layer 21, the spacer layer 22, and the electron supply layer 23 are formed by causing nitride semiconductor layers to epitaxially grow. Thereby, in the electron transport layer 21, the 2DEG 21a is generated in the vicinity of the interface between the electron transport layer 21 and the spacer layer 22. Subsequently, the element isolation area for isolating the element is formed (not illustrated).

Figure 17B:
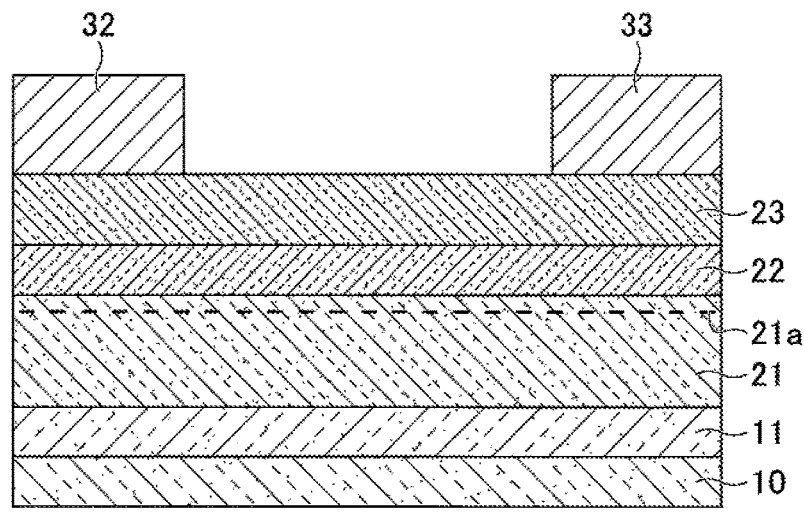

Next, as illustrated in FIG. 17B, the source electrode 32 and the drain electrode 33 are formed on the electron supply layer 23.

Figure 17C:
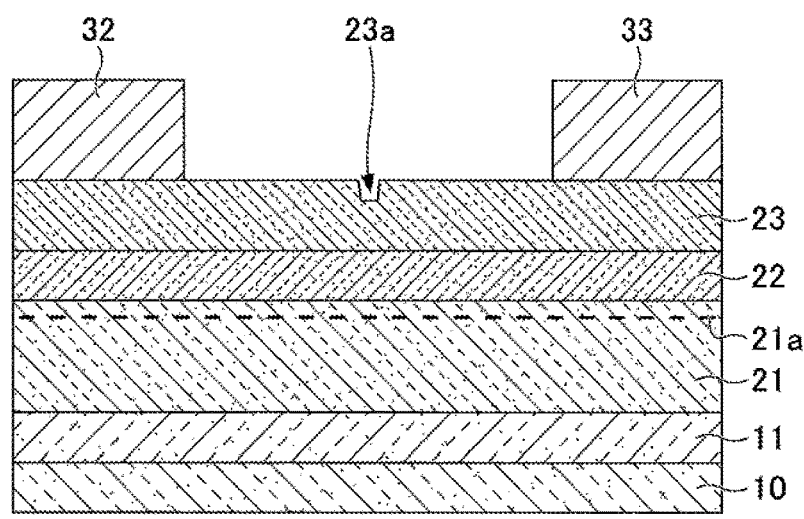

Next, as illustrated in FIG. 17C, a gate recess 23a is formed at an area of the electron supply layer 23 where the gate electrode 31 is to be formed. Specifically, a photoresist is applied on the electron supply layer 23, and the photoresist is exposed by the exposure apparatus and developed to form a resist pattern (not illustrated) having an opening portion at an area where the gate recess 23a is to be formed. Subsequently, a part of the electron supply layer 23 exposed at the opening portion of the resist pattern is removed through dry etching such as RIE to form the gate recess 23a. In other words, a part of the electron supply layer 23 is removed to form the gate recess 23a at the area on which the gate electrode 31 is to be formed. Subsequently, the resist pattern (not illustrated) is removed by an organic solvent or the like.

Figure 18A:
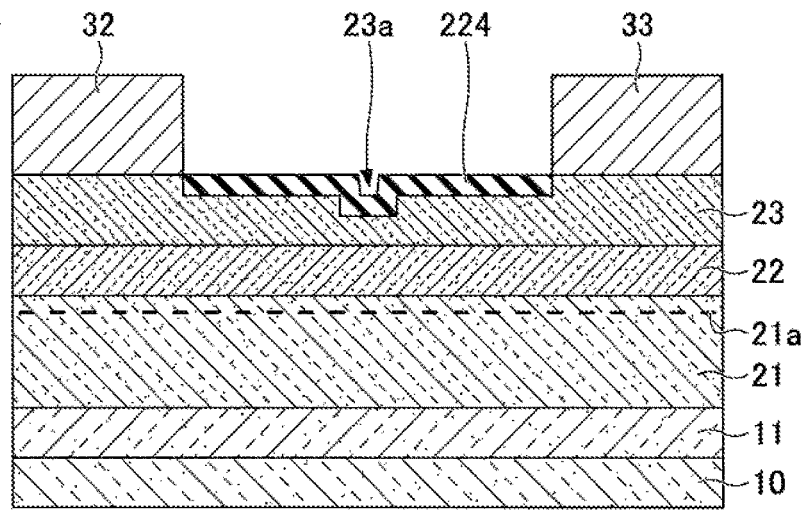
FIGS. 18A to 18C are diagrams illustrating processes (2) of the method for producing the semiconductor device according to the third embodiment.

Next, as illustrated in FIG. 18A, exposed $In_{0.1}Al_{0.82}N$ forming the electron supply layer 23 is oxidized with water vapor to form the metal oxide film 224. Specifically, water vapor at a temperature of from 300° C. to 500° C. is used to oxidize $In_{0.18}Al_{0.82}N$ to form the metal oxide film 224. Thus, the metal oxide film 224 is formed on the surface of the electron supply layer 23, and the bottom surface and the side surfaces of the gate recess 23a.

Figure 18B:
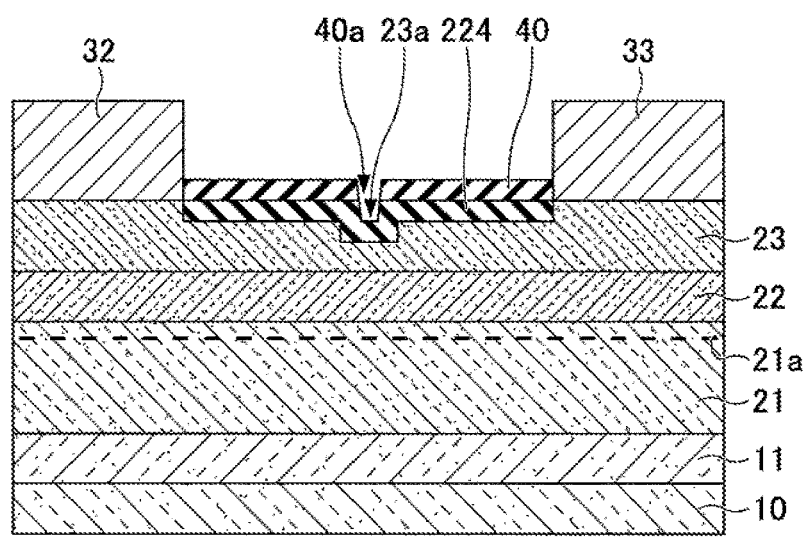

Next, as illustrated in FIG. 18B, the protective film 40 is formed on the metal oxide film 224. The protective film 40 has an opening portion 40a, at an area where the gate electrode 31 is to be formed, that is the area where the gate recess 23a has been formed.

Figure 18C:
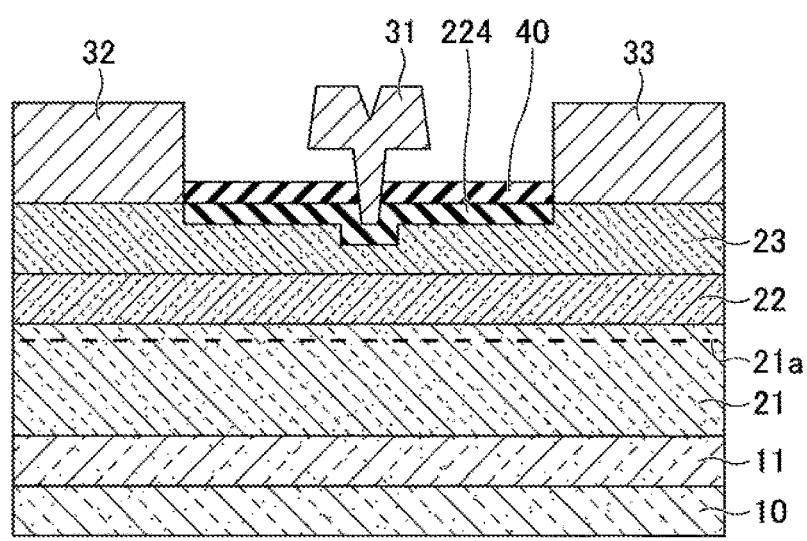

Next, as illustrated in FIG. 18C, the gate electrode 31 is formed on the metal oxide film 224. The gate electrode 31 is formed at the area where the gate recess 23a is formed at the opening portion 40a of the protective film 40.

The semiconductor device according to the third embodiment can be produced through the above described processes.

Note that other configurations of the third embodiment are similar to those of the first embodiment.

Fourth Embodiment (Semiconductor Device)

Next, a semiconductor device according to a fourth embodiment will be described with reference to FIG. 19.

Figure 19:
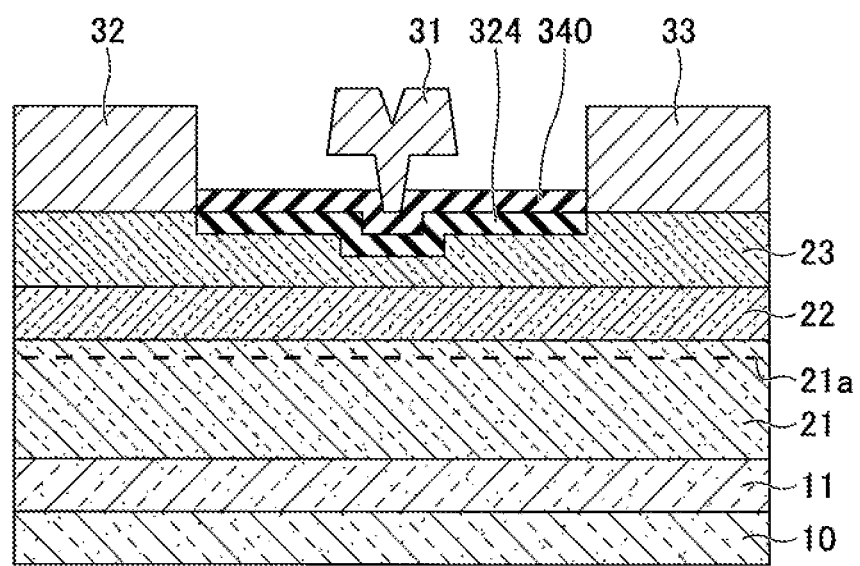
FIG. 19 is a diagram illustrating a structure of a semiconductor device according to a fourth embodiment.

As illustrated in FIG. 19, in the semiconductor device according to the fourth embodiment, a gate recess is formed on the electron supply layer 23, a metal oxide film 324 is formed by oxidizing, with water vapor, the exposed surface of the electron supply layer 23, and an insulation film 340 is formed on the metal oxide film 324. Thus, the metal oxide film 324 and the insulation film 340 are formed on the bottom surface and the side surfaces of the gate recess where the gate electrode 31 is to be formed. By forming the metal oxide film 324 and the insulation film 340 on the bottom surface and the side surfaces of the gate recess, it is possible to make the gate voltage closer to normally-off and to further inhibit a gate leak-current.

(Method for Producing Semiconductor Device)

Next, a method for producing the semiconductor device according to the fourth embodiment will be described with reference to FIG. 20 and FIG. 21.

Figure 20A:
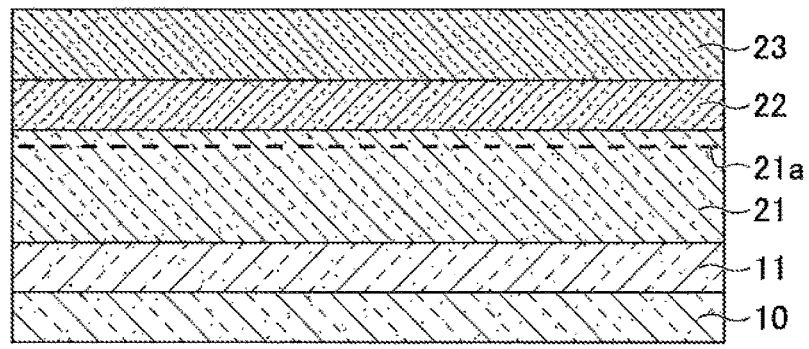
FIGS. 20A to 20C are diagrams illustrating processes (1) of a method for producing the semiconductor device according to the fourth embodiment.

First, as illustrated in FIG. 20A, on the substrate 10, the buffer layer 11, the electron transport layer 21, the spacer layer 22, and the electron supply layer 23 are formed by causing nitride semiconductor layers to epitaxially grow. Thereby, in the electron transport layer 21, the 2DEG 21a is generated in the vicinity of the interface between the electron transport layer 21 and the spacer layer 22. Subsequently, the element isolation area for isolating the element is formed (not illustrated).

Figure 20B:
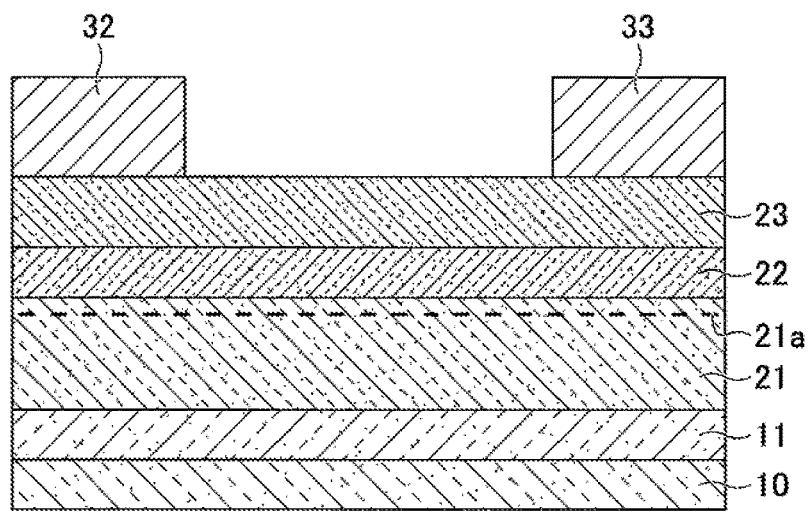

Next, as illustrated in FIG. 20B, the source electrode 32 and the drain electrode 33 are formed on the electron supply layer 23.

Figure 20C:
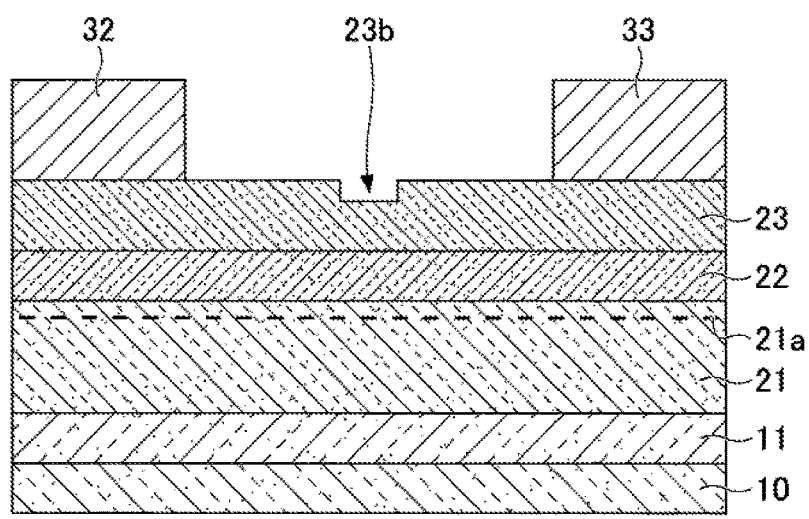

Next, as illustrated in FIG. 20C, a gate recess 23b is formed at an area of the electron supply layer 23 where the gate electrode 31 is to be formed.

Figure 21A:
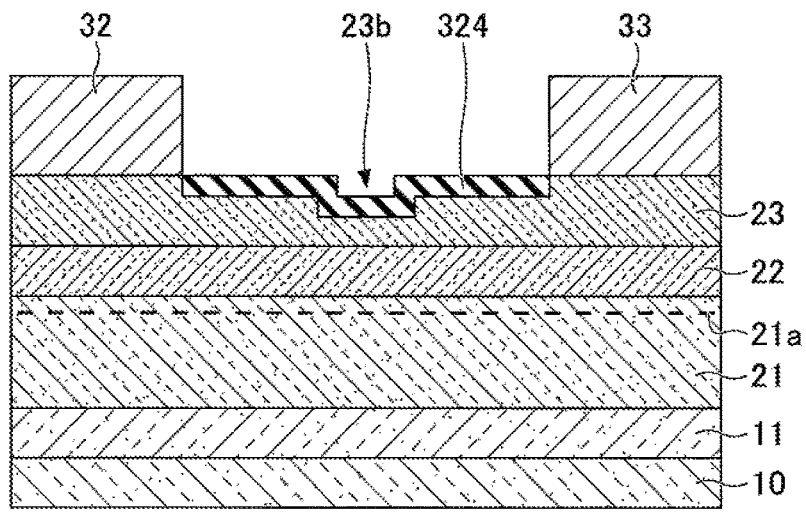
FIGS. 21A to 21C are diagrams illustrating processes (2) of the method for producing the semiconductor device according to the fourth embodiment.

Next, as illustrated in FIG. 21A, $In_{0.18}Al_{0.82}N$ forming the electron supply layer 23 is oxidized with water vapor to form the metal oxide film 324. Specifically, water vapor at a temperature of from 300° C. to 500° C. is used to oxidize $In_{0.18}Al_{0.82}N$ to form the metal oxide film 324. Thus, the metal oxide film 324 is formed on the surface of the electron supply layer 23, and the bottom surface and the side surfaces of the gate recess 23b.

Figure 21B:
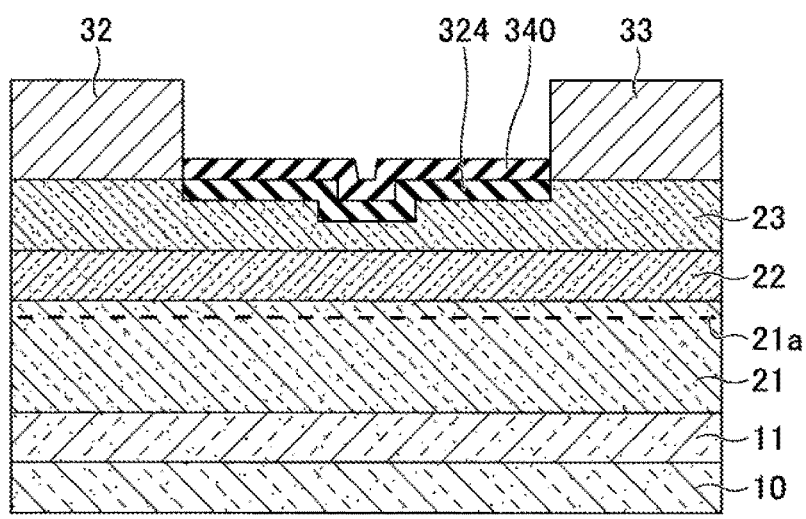

Next, as illustrated in FIG. 21B, the insulation film 340 is formed on the metal oxide film 324. The insulation film 340 is also formed on the metal oxide film 324 that is formed on the bottom surface and the side surfaces of the gate recess 23b. According to the fourth embodiment, a SiN film, of which the film thickness is from 10 nm to 100 nm, is deposited (formed) through plasma chemical vapor deposition (CVD) or the like to form the insulation film 340. The insulation film 340, formed as described above, has a function to decrease a gate-leak current at the area where the gate electrode 31 is formed and has a function as a protective film at other areas. Note that, the insulation film 340 may be formed of a material such as $Al_2O_3$, $HfO_2$, $SiO_2$, SiON, AlN, or AlON instead of SiN.

Figure 21C:
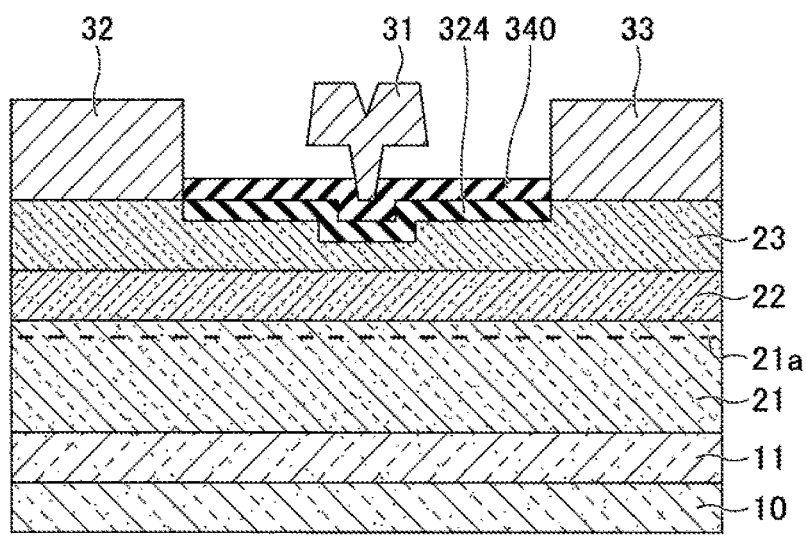

Next, as illustrated in FIG. 21C, the gate electrode 31 is formed on the insulation film 340. The gate electrode 31 is formed at the area where the gate recess 23b had been formed.

The semiconductor device according to the fourth embodiment can be produced through the above described processes.

Note that other configurations of the fourth embodiment are similar to those of the first embodiment.

Fifth Embodiment

Next, a fifth embodiment will be described. The fifth embodiment relates to a semiconductor device, a power supply device, and a high-frequency amplifier.

Figure 22:
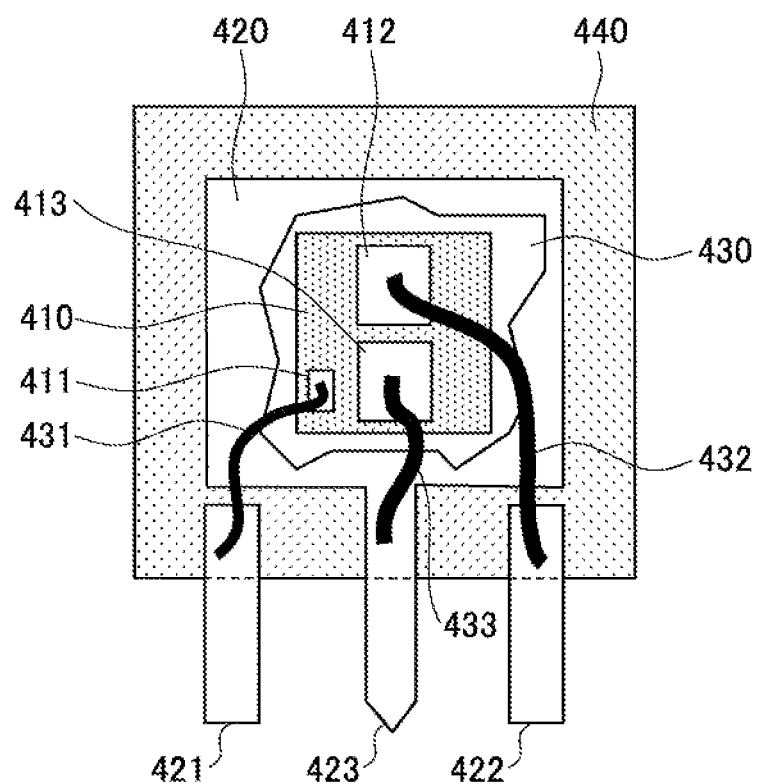
FIG. 22 is a diagram illustrating a semiconductor device discretely packaged according to a fifth embodiment.

The semiconductor device according to the fifth embodiment is a semiconductor device discretely packaged according to one of the first to fourth embodiments, and the discretely packaged semiconductor device will be described with reference to FIG. 22. Note that FIG. 22 schematically illustrates the inside of the discretely packaged semiconductor device in which positions of the electrodes and the like may be different from those in the first to fourth embodiments. Further, in the description of the fifth embodiment, one transistor having HEMT or UMOS structure may be formed in the semiconductor device according to one of the first to fourth embodiments.

First, a semiconductor device produced according to one of the first to fourth embodiments is cut by dicing or the like to form a semiconductor chip 410, which is a HEMT made of GaN semiconductor materials. The semiconductor chip 410 is fixed on a lead frame 420 by a die attachment agent 430 such as solder. Note that the semiconductor chip 410 corresponds to one of the semiconductor devices in the first to fourth embodiments.

Next, a gate electrode 411 is coupled to a gate lead 421 by a bonding wire 431, a source electrode 412 is coupled to a source lead 422 by a bonding wire 432, and a drain electrode 413 is coupled to a drain lead 423 by a bonding wire 433. Note that the bonding wires 431, 432, and 433 are formed of a metal material such as Al. According to the fifth embodiment, the gate electrode 411 is a gate electrode pad in the present embodiment, which is coupled to the gate electrode 31 of the semiconductor device according to one of the first to fourth embodiments. Also, the source electrode 412 is a source electrode pad, which is coupled to the source electrode 32 of the semiconductor device according to one of the first to fourth embodiments. Also, the drain electrode 413 is a drain electrode pad, which is coupled to the drain electrode 33 of the semiconductor device according to one of the first to fourth embodiments.

Next, resin sealing is performed by a transfer molding method using a mold resin 440. In this way, the discretely packaged semiconductor device such as the HEMT using GaN semiconductor materials can be produced.

Next, the power source device and the high-frequency amplifier will be described according to the fifth embodiment. The power source device and the high-frequency amplifier according to the fifth embodiment are a power source device and a high-frequency amplifier using a semiconductor device according to any one of the first to fourth embodiments.

Figure 23:
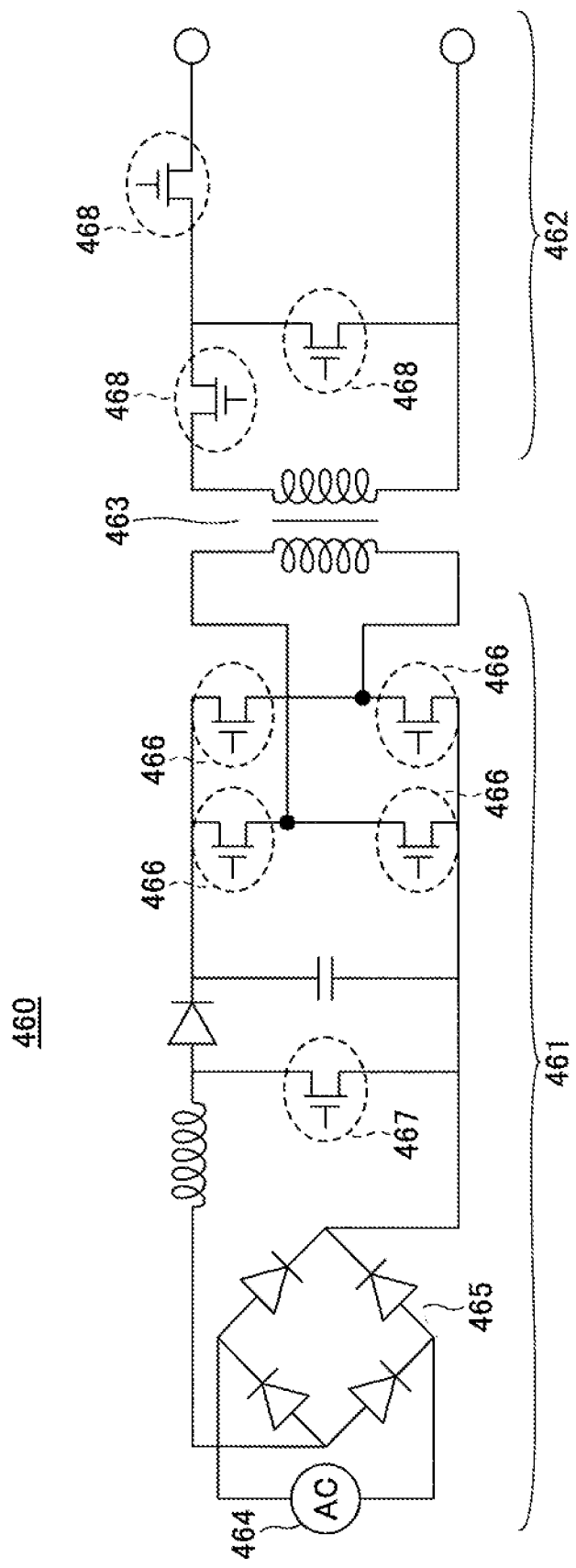
FIG. 23 is a circuit diagram of a power supply device according to the fifth embodiment.

First, the power source device in the fifth embodiment will be described with reference to FIG. 23. The power source device 460 according to the fifth embodiment includes a high-voltage primary circuit 461, a low-voltage secondary circuit 462, and a transformer 463 disposed between the primary circuit 461 and the secondary circuit 462. The primary circuit 461 includes an AC power supply 464, multiple switching elements 466 (four in this example of FIG. 23), one switching element 467, and the like. The secondary circuit 462 includes multiple switching elements 468 (three in this example of FIG. 23). In the example illustrated in FIG. 23, the semiconductor device according to one of the first to fourth embodiments is used as the switching elements 466 and 467 of the primary circuit 461. Note that it is preferable that the switching elements 466 and 467 of the primary circuit 461 are a normally-off semiconductor device. The switching elements 468, used in the secondary circuit 462, use typical MISFETs (metal insulator semiconductor field effect transistor) formed of silicon.

Figure 24:
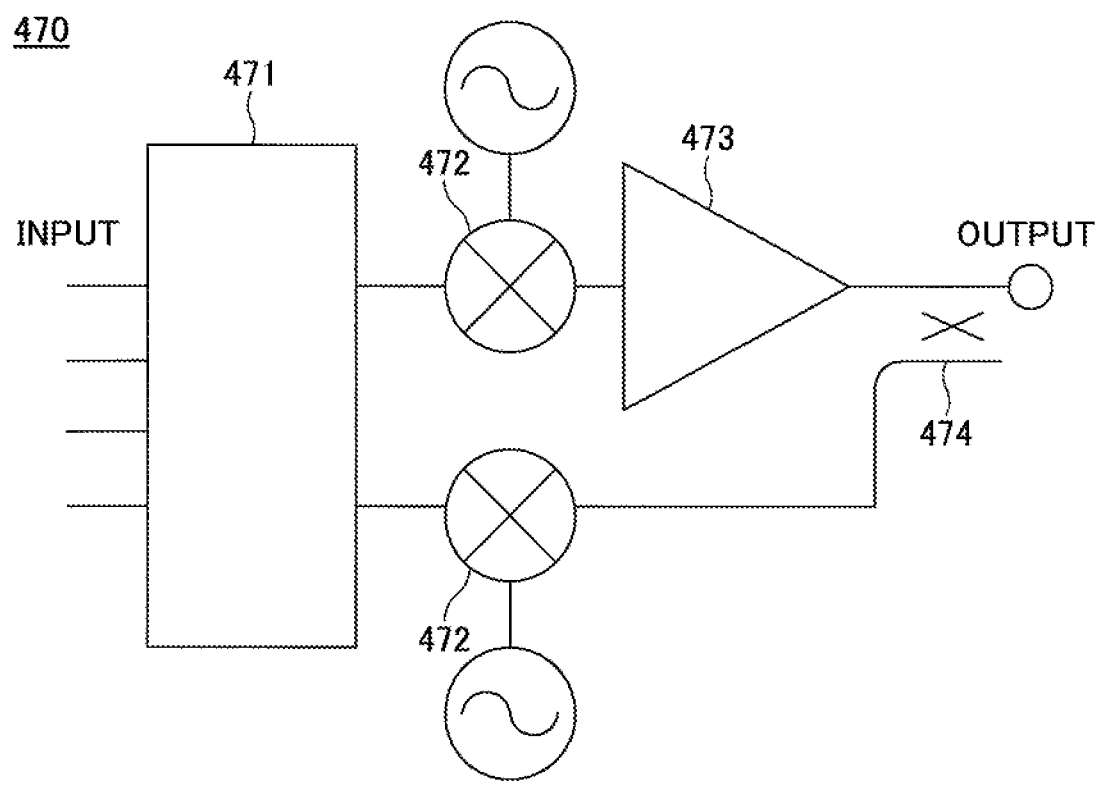
FIG. 24 is a diagram illustrating a structure of a high-output amplifier according to the fifth embodiment.

Next, the high-frequency amplifier in the fifth embodiment will be described with reference to FIG. 24. The high frequency amplifier 470 in the fifth embodiment may be applied to a power amplifier for base station of a mobile phone, for example. This high-frequency amplifier 470 includes a digital predistortion circuit 471, mixers 472, a power amplifier 473, and a directional coupler 474. The digital predistortion circuit 471 compensates for non-linear distortion of an input signal. The mixer 472 mixes the input signal compensated for non-linear distortion, with an alternating current signal. The power amplifier 473 amplifies the input signal having been mixed with the alternating current signal. In the example illustrated in FIG. 24, the power amplifier 473 includes a semiconductor device according to one of the first to fourth embodiments. The directional coupler 474 monitors an input signal and an output signal. In the circuit illustrated in FIG. 24, by turning on/off a switch, for example, it is possible to mix an output signal with an alternating current signal by using the mixer 472, and to transmit the mixed signal to the digital predistortion circuit 471.

A semiconductor device according to an embodiment includes a first semiconductor layer formed, on a substrate, of a nitride semiconductor; a second semiconductor layer formed, on the first semiconductor layer, of a nitride semiconductor; a source electrode formed on the second semiconductor layer; a drain electrode formed on the second semiconductor layer; a metal oxide film formed, between the source electrode and the drain electrode, on the second semiconductor layer; and a gate electrode formed on the metal oxide film, wherein the second semiconductor layer is formed of a material including InAlN or InAlGaN, and wherein a value of $AlO_x/InO_x$ in the metal oxide film is greater than a value of Al/In in the second semiconductor layer.

The embodiments have been specifically described above, but the present invention is not limited to the specific embodiments and various modifications and variations may be made without departing from the scope of the present invention.

All examples and conditional language provided herein are intended for pedagogical purposes of aiding the reader in understanding the invention and the concepts contributed by the inventors to further the art, and are not to be construed as limitation to such specifically recited examples and conditions, nor does the organization of such examples in the specification relate to a showing of superiority and inferiority of the invention. Although one or more embodiments of the present invention have been described in detail, it should be understood that various changes, substitutions, and alterations could be made hereto without departing from the spirit and scope of the invention.

What is claimed is:

1. A method for producing a semiconductor device, the method comprising:
   forming, on a substrate, a first semiconductor layer of a nitride semiconductor;
   forming, on the first semiconductor layer, a second semiconductor layer of a nitride semiconductor;
   forming a source electrode and a drain electrode on the second semiconductor layer;
   forming a metal oxide film by oxidizing, with water vapor, a surface of the second semiconductor layer between the source electrode and the drain electrode such that the metal oxide film includes $AlO_x$ and $InO_x$ and $AlO_x/InO_x$ in the metal oxide film is greater than or equal to 4.6; and
   forming a gate electrode on the metal oxide film.

2. The method according to claim 1, wherein the metal oxide film is formed by oxidizing the surface of the second semiconductor layer with water vapor of which a temperature is greater than or equal to 300° C. and less than or equal to 800° C.

3. The method according to claim 1, wherein the metal oxide film is formed by oxidizing the surface of the second semiconductor layer with water vapor of which a temperature is greater than or equal to 300° C. and less than or equal to 500° C.

4. The method according to claim 1 further comprising:
   forming an insulation film, having an opening portion at an area where the gate electrode is to be formed on the metal oxide film, after the metal oxide film is formed,
   wherein the gate electrode is formed on the metal oxide film at the opening portion of the insulation film.

5. The method according to claim 1 further comprising:
   removing a part of the second semiconductor layer to form a gate recess at an area on which the gate electrode is to be formed, after the second semiconductor layer is formed,
   wherein the metal oxide film is formed by oxidizing the second semiconductor layer with water vapor after the gate recess is formed, and
   wherein the gate electrode is formed on the area where the gate recess is formed.

6. The method according to claim 1, wherein the second semiconductor layer is formed of a material including InAlN or InAlGaN.

* * * * *